(12) United States Patent
Wu et al.

(10) Patent No.: US 12,288,723 B2
(45) Date of Patent: Apr. 29, 2025

(54) SEMICONDUCTOR DEVICE AND MANUFACTURING METHOD THEREOF

(71) Applicant: TAIWAN SEMICONDUCTOR MANUFACTURING COMPANY, LTD., Hsinchu (TW)

(72) Inventors: Chi-Wei Wu, Hsinchu (TW); Hsin-Che Chiang, Taipei (TW); Chun-Sheng Liang, Changhua County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 416 days.

(21) Appl. No.: 17/741,856

(22) Filed: May 11, 2022

(65) Prior Publication Data
US 2023/0369135 A1   Nov. 16, 2023

(51) Int. Cl.
*H01L 21/8238* (2006.01)
*H01L 21/762* (2006.01)
*H01L 27/092* (2006.01)

(52) U.S. Cl.
CPC ........ *H01L 21/823878* (2013.01); *H01L 21/76232* (2013.01); *H01L 21/823814* (2013.01); *H01L 21/823821* (2013.01); *H01L 21/823871* (2013.01); *H01L 27/0924* (2013.01)

(58) Field of Classification Search
CPC ....... H01L 21/823878; H01L 21/76232; H01L 21/823814; H01L 21/823821; H01L 21/823871; H01L 27/0924; H01L 21/823431; H01L 21/823475; H01L 21/823481

See application file for complete search history.

(56) References Cited

U.S. PATENT DOCUMENTS

| | | | |
|---|---|---|---|
| 8,962,400 B2 | 2/2015 | Tsai et al. | |
| 9,093,514 B2 | 7/2015 | Tsai et al. | |
| 9,236,267 B2 | 1/2016 | De et al. | |
| 9,245,805 B2 | 1/2016 | Yeh et al. | |
| 9,418,897 B1 | 8/2016 | Ching et al. | |
| 9,520,482 B1 | 12/2016 | Chang et al. | |
| 9,576,814 B2 | 2/2017 | Wu et al. | |
| 9,608,116 B2 | 3/2017 | Ching et al. | |
| 9,812,363 B1 | 11/2017 | Liao et al. | |
| 9,859,380 B2 | 1/2018 | Lee et al. | |

(Continued)

*Primary Examiner* — Karen Kusumakar
*Assistant Examiner* — Adam S Bowen
(74) *Attorney, Agent, or Firm* — Birch, Stewart, Kolasch & Birch, LLP

(57) ABSTRACT

A method includes forming first and second gate stacks extending across a semiconductor fin on a substrate; forming source/drain regions in the semiconductor fin, wherein one of the source/drain region is between the first and second gate stacks; forming a dielectric layer laterally surrounding the first and second gate stacks; doping a portion of the dielectric layer between the first and second gate stacks with a dopant; removing the second gate stack to form a gate trench next to the doped first portion of the dielectric layer; performing an annealing process to expand the doped first portion of the dielectric layer toward the gate trench; forming an isolation structure in the gate trench and next to the expanded first portion of the dielectric layer; forming a source/drain contact extending through the dielectric layer to the one of the source/drain regions.

20 Claims, 15 Drawing Sheets

(56) References Cited

U.S. PATENT DOCUMENTS

| | | | |
|---|---|---|---|
| 10,128,240 B2* | 11/2018 | Min | H01L 29/7848 |
| 2018/0261596 A1* | 9/2018 | Jun | H01L 21/823431 |
| 2018/0350692 A1* | 12/2018 | Deng | H01L 21/32 |
| 2019/0122940 A1* | 4/2019 | Chang | H01L 21/823814 |
| 2019/0165137 A1* | 5/2019 | Chen | H01L 21/823821 |

* cited by examiner

SEMICONDUCTOR DEVICE AND MANUFACTURING METHOD THEREOF

BACKGROUND

Semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
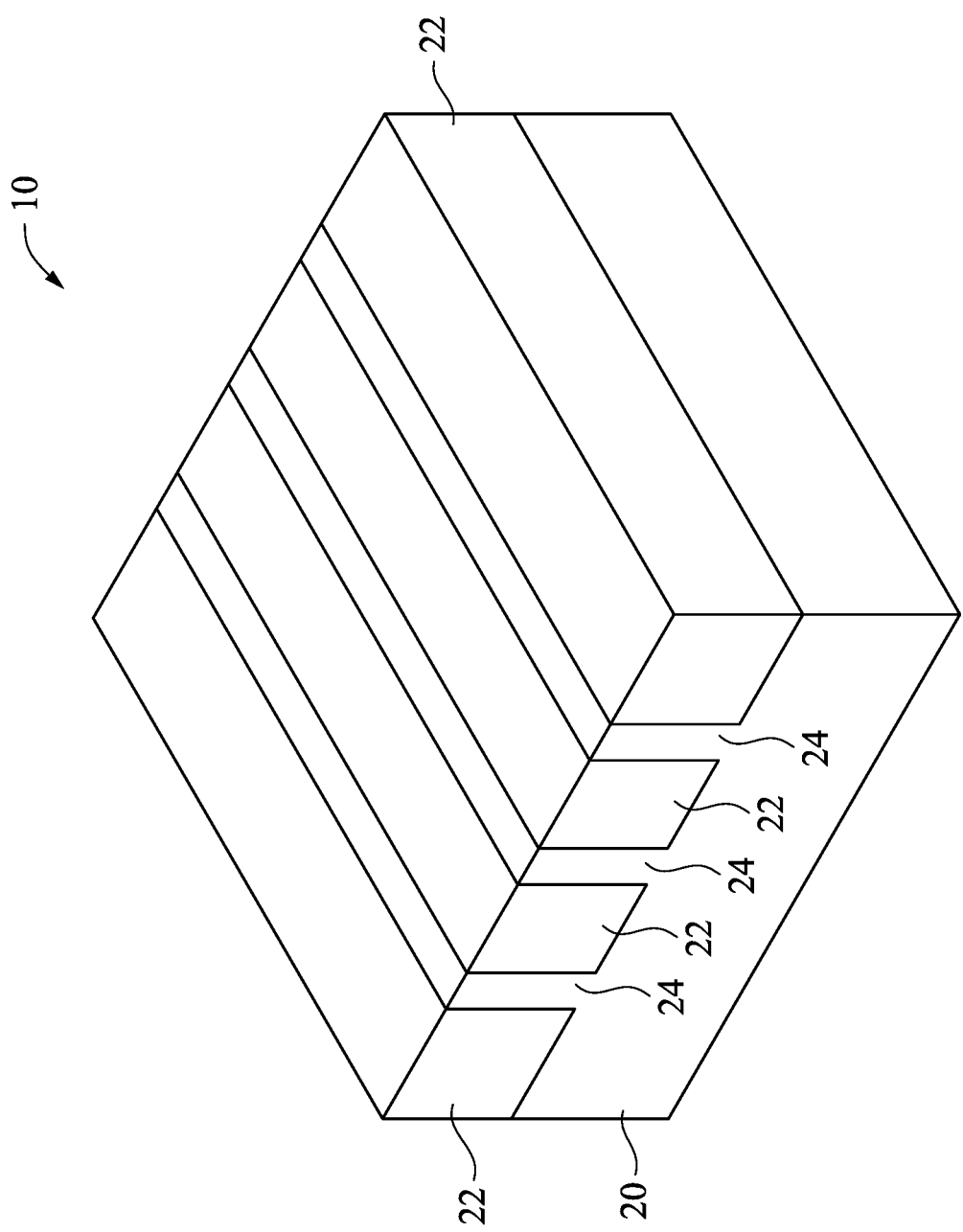
FIGS. 1-4, 5A, 5B, 6-8, 9A, 9B, 10A, 10B, 11A, 11B, 12-14, 15A, 15B, 16, 17A, and 17B illustrate the perspective views, cross-sectional views, and top views of intermediate stages in the formation of an isolation region and semiconductor devices in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" may mean within 20 percent, or within 10 percent, or within 5 percent of a given value or range. One skilled in the art will realize, however, that the value or range recited throughout the description are merely examples, and may be reduced with the down-scaling of the integrated circuits. Numerical quantities given herein are approximate, meaning that the term "around," "about," "approximately," or "substantially" can be inferred if not expressly stated.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present disclosure are directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with one or more FinFET examples to illustrate various embodiments of the present disclosure. It is understood, however, that the application should not be limited to a particular type of device, except as specifically claimed.

The fins may be patterned by any suitable method. For example, the fins may be patterned using one or more photolithography processes, including double-patterning or multi-patterning processes. The double-patterning or the multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

In the course of IC evolution, a chip area has been scaling down. In order to reduce coupling effects between different semiconductor devices in scaled down chip area, a continuous poly on oxide definition edge (CPODE) pattern is provided to cut the noise coupling path. The CPODE pattern is formed by firstly forming a trench by removing a dummy material and a portion of a semiconductor body, and then filling a dielectric material in the trench. However, when a source/drain contact opening is formed laterally adjacent to the CPODE pattern, the CPODE pattern will squeeze the source/drain contact opening (i.e., metal-diffusion (MD) layer CD shrinkage occurring near the CPODE side), so that the size of the source-drain contact subsequently formed in the opening will become smaller. In addition, the smaller size of the opening will be difficult to form silicide therein, which in turn further increases the resistance of the source-drain contact.

Therefore, the present disclosure in various embodiments provides an impurity (e.g., Ge) implantation process performed on a dielectric layer where the CPODE pattern will be formed there-around. The implanted dielectric layer can be interchangeably referred to as a stress memorization technology (SMT) layer that can control the profile of the adjacent CPODE pattern formed subsequently, so as to prevent the CPODE pattern from squeezing the source/drain contact opening in the implanted dielectric layer and improve the process window for forming the source-drain contact and silicide in the source/drain contact opening, such that the resistance of the source-drain contact can be reduced.

FIGS. 1-4, 5A, 5B, 6-8, 9A, 9B, 10A, 10B, 11A, 11B, 12-14, 15A, 15B, 16, 17A, and 17B illustrate the perspective views, cross-sectional views, and top views of intermediate stages in the formation of semiconductor devices in accordance with some embodiments.

Referring is made to FIG. 1. FIG. 1 illustrates a perspective view of an initial structure. The initial structure includes a wafer 10, which further includes a substrate 20. The substrate 20 may be a semiconductor substrate, which may be a silicon substrate, a silicon germanium substrate, or a substrate formed of other semiconductor materials. The substrate 20 may be doped with a p-type or an n-type impurity. Isolation regions 22 such as shallow trench isolation (STI) regions may be formed to extend from a top surface of the substrate 20 into the substrate 20. Portions of the substrate 20 between the neighboring isolation regions 22 are referred to as semiconductor fins 24. In some embodiments, the semiconductor fin 24 can be interchangeably referred to a semiconductor strip or a nanostructured pedestal having a top surface and opposite side surfaces. In some embodiments, the semiconductor fins 24 are parts of the original substrate 20, and hence the material of the semiconductor fins 24 is the same as that of the substrate 20. In some embodiments, the semiconductor fins 24 are replacement strips formed by etching the portions of the substrate 20 between the isolation regions 22 to form recesses, and performing an epitaxy process to regrow another semiconductor material in the recesses. Accordingly, semiconductor fins 24 are formed of a semiconductor material different from that of substrate 20. In some embodiments, the semiconductor fins 24 are formed of Si, SiP, SiC, SiPC, SiGe, SiGeB, Ge, a III-V compound semiconductor such as InP, GaAs, AlAs, InAs, InAlAs, InGaAs, or the like.

In some embodiments, the method of forming the isolation regions 22 may include depositing an isolation dielectric on the substrate 20 to cover the semiconductor fins 24, optionally performing a planarization process, such as a chemical mechanical polishing (CMP) process, to remove the excess isolation dielectric outside the trenches between the semiconductor fins 24. The isolation dielectric may include any suitable dielectric material, such as silicon oxide.

Figure 2:
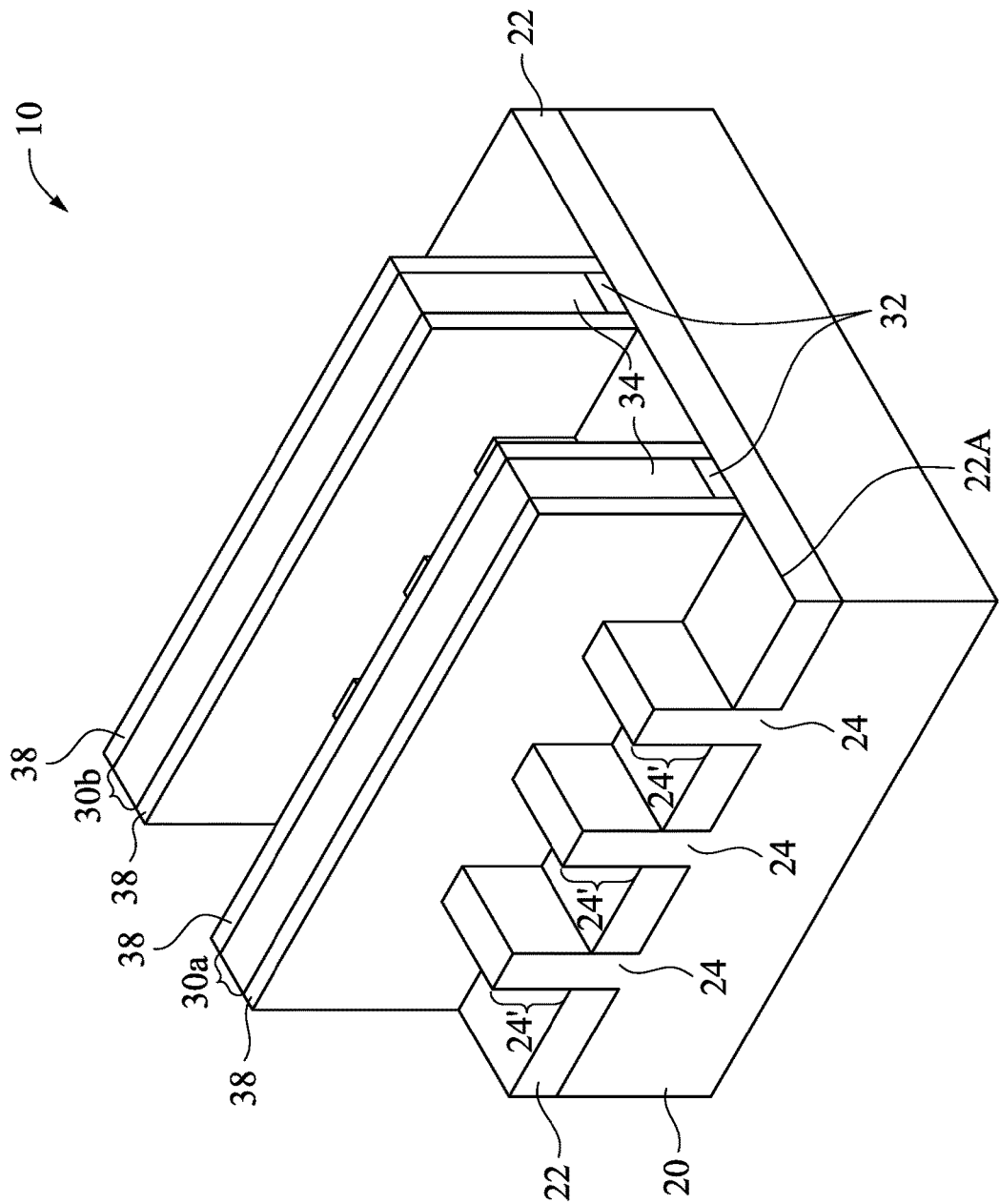

Reference is made to FIG. 2. An etching process is performed on the isolation regions 22 until upper portions of the semiconductor fins 24 are exposed. In some embodiments, the etching process performed may be a wet etching process, such as that in which the substrate 20 is dipped in hydrofluoric acid (HF). In some embodiments, the etching process may be a dry etching process. For example, the dry etching process may be performed using $HF/NH_3$ or $NF_3/NH_3$ as the etching gas. The top portions of semiconductor fins 24 protrude higher than the top surfaces 22A of the remaining portions of isolation regions 22 to form protruding fins 24', respectively. In some embodiments, the isolation regions 22 can be interchangeably referred to as shallow trench isolation (STI) regions.

Dummy gate stacks 30a, 30b and gate spacers 38 are formed on the top surfaces and the sidewalls of the fins 24'. The dummy gate stacks 30a, 30b may include dummy gate dielectrics 32 and dummy gate electrodes 34 over dummy gate dielectrics 32. The dummy gate electrodes 34 may be formed, for example, using polysilicon or amorphous silicon, and other materials may also be used. The dummy gate stacks 30a, 30b may cross over a single one or a plurality of protruding fins 24' and/or isolation regions 22. The dummy gate stacks 30a, 30b also have lengthwise directions perpendicular to the lengthwise directions of the fins 24'.

Subsequently, gate spacers 38 are formed on the sidewalls of the dummy gate stacks 30a, 30b. In some embodiments, the gate spacers 38 are formed of a dielectric material such as silicon nitride (SiN), silicon oxide ($SiO_2$), silicon carbo-nitride (SiCN), silicon oxynitride (SiON), silicon oxy-carbo-nitride (SiOCN), or the like, and may have a single-layer structure or a multi-layer structure including a plurality of dielectric layers.

Figure 3:
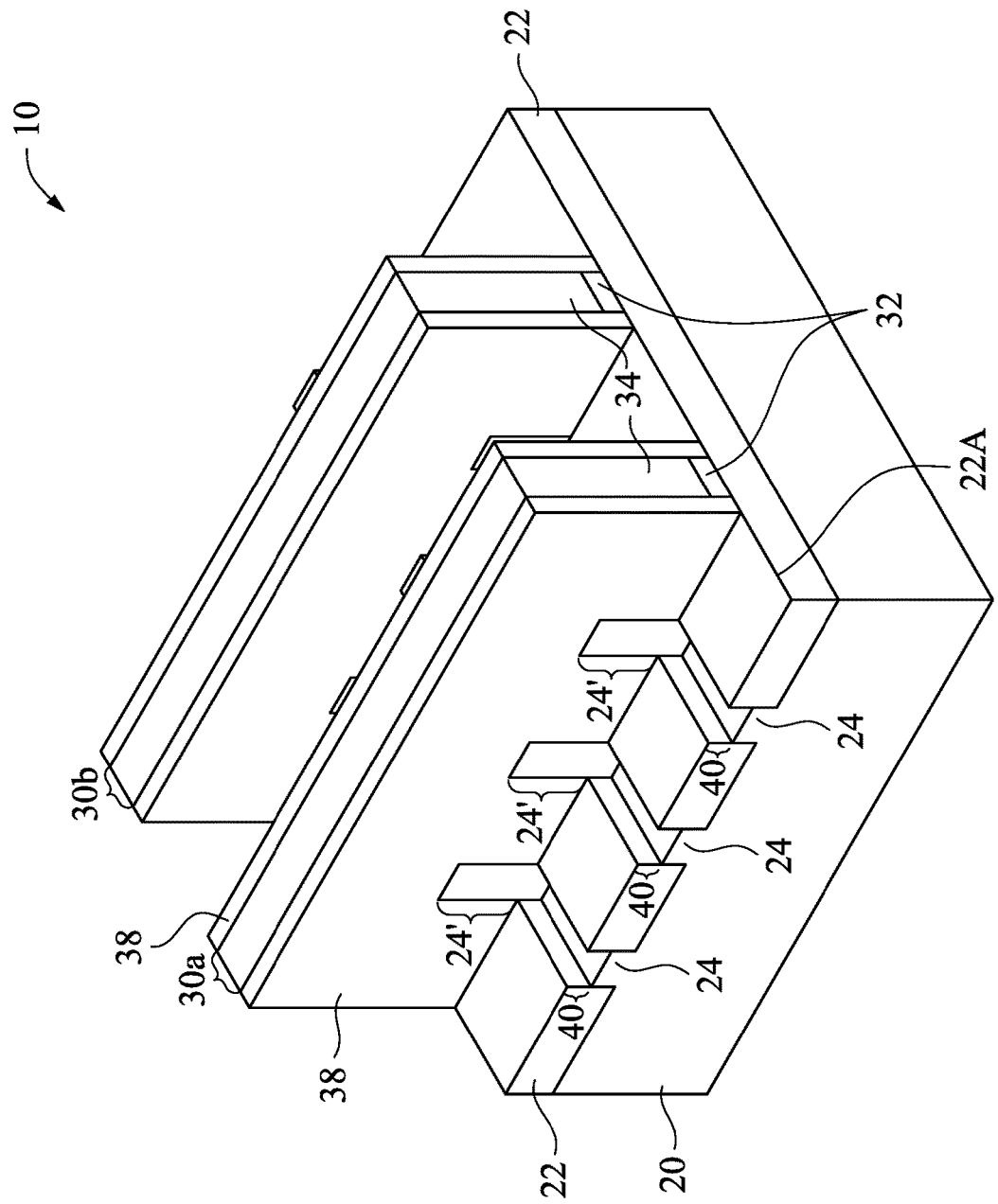

Reference is made to FIG. 3. An etching process is performed to etch the fins 24' that are not covered by the dummy gate stack 30a, 30b and the gate spacers 38, resulting in the structure shown in FIG. 3. In some embodiments, the etching process can be interchangeably referred to as a source/drain recessing process. The recessing may be anisotropic, and hence the portions of the fins 24' directly underlying the dummy gate stacks 30a, 30b and the gate spacers 38 are protected, and are not etched. The top surfaces of the recessed semiconductor fins 24 may be lower than the top surfaces 22A of isolation regions 22 in accordance with some embodiments. The spaces left by the etched portions of the fins 24' are referred to as recesses 40. In some embodiments, the fins 24' may be etched using the mixture of $NF_3$ and $NH_3$, the mixture of HF and $NH_3$, or the like.

Figure 4:
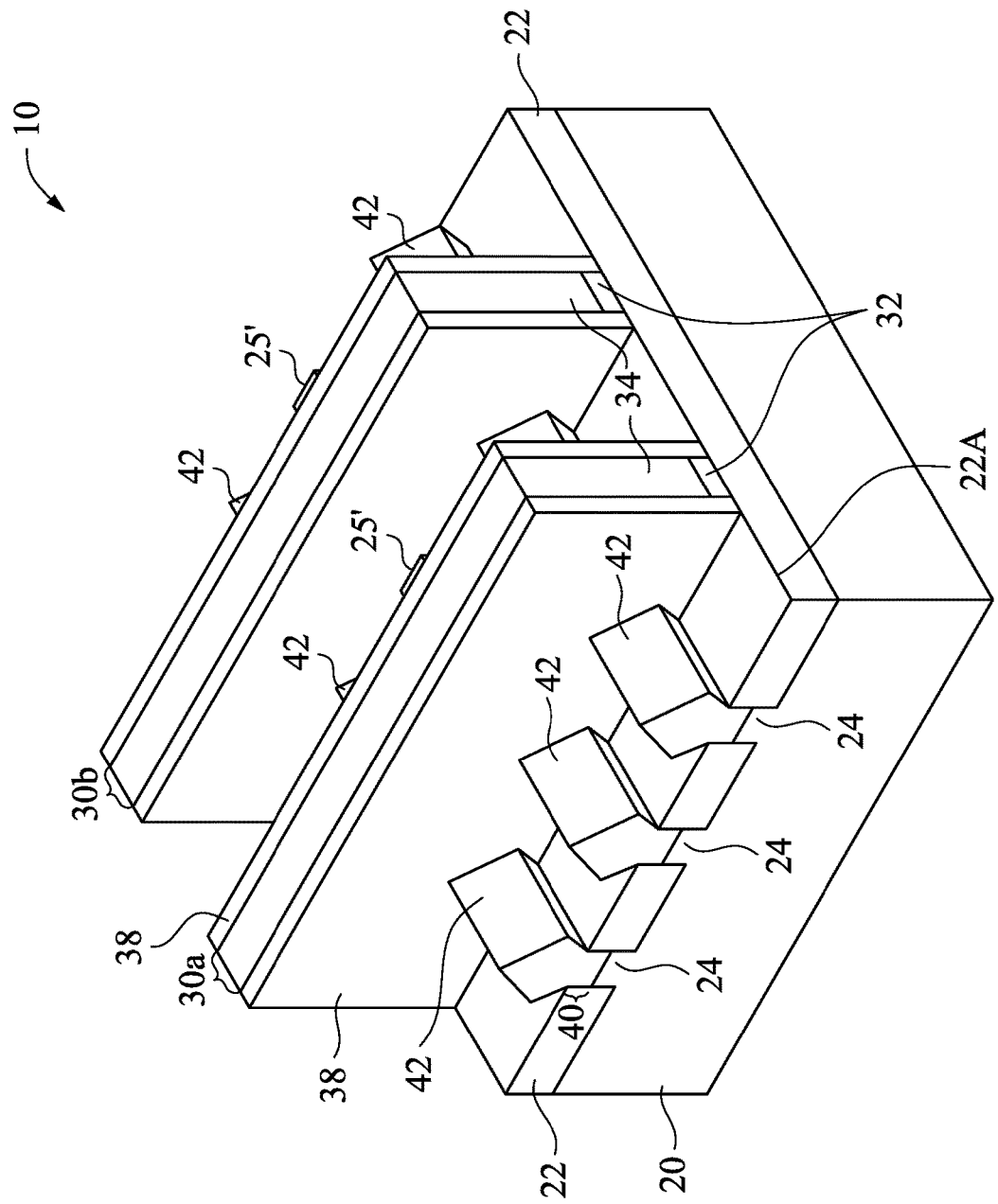

Reference is made to FIG. 4. Epitaxy regions 42 are formed by selectively growing a semiconductor material from the recesses 40, resulting in the structure in FIG. 4. In some embodiments, the epitaxy regions 42 include silicon germanium, silicon, silicon carbon, or the like. Depending on whether the resulting semiconductor device is a p-type semiconductor device or an n-type semiconductor device, a p-type or an n-type impurity may be in-situ doped with the proceeding of the epitaxy. For example, when the resulting semiconductor device is a p-type semiconductor device, silicon germanium boron (SiGeB), SiB, GeB, or the like may be grown. Conversely, when the resulting semiconductor device is an n-type semiconductor device, silicon phosphorous (SiP), silicon carbon phosphorous (SiCP), or the like, may be grown. In some embodiments, the epitaxy regions 42 are formed of a III-V compound semiconductor such as GaAs, InP, GaN, InGaAs, InAlAs, GaSb, AlSb, AlAs, AlP, GaP, combinations thereof, or multi-layers thereof. After the epitaxy regions 42 fully fill the recesses 40, the epitaxy regions 42 start expanding horizontally, and facets may be formed. In some embodiments, the epitaxy regions 42 can be interchangeably referred to as epitaxial structures, source/drain regions, or source/drain patterns.

Figure 5A:
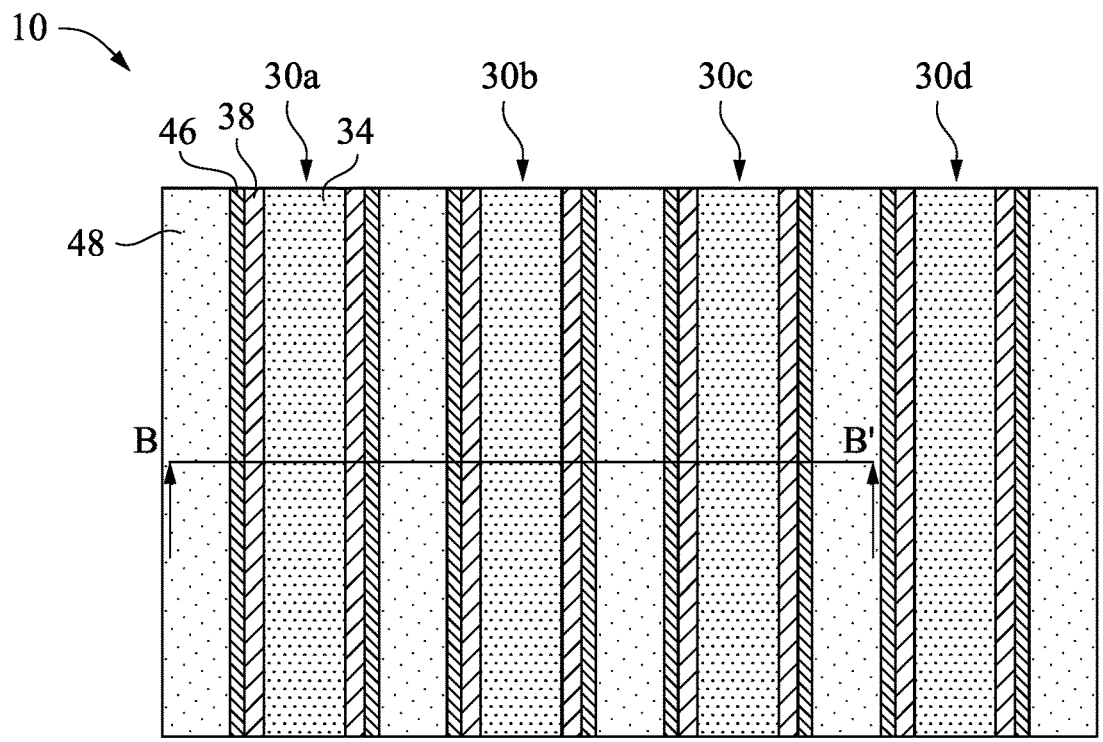
Figure 5B:
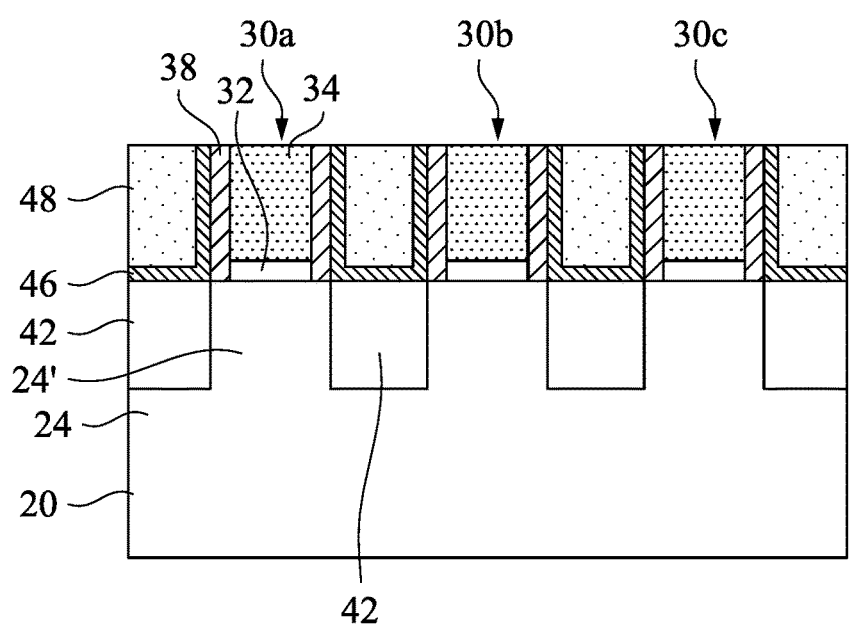

Reference is made to FIGS. 5A and 5B. FIG. 5A illustrates a plane view (a top view) of a part of the wafer 10 after the formation of a contact etch stop layer (CESL) 46 and an inter-layer dielectric (ILD) layer 48. FIG. 5B illustrates a cross-sectional view obtained from reference cross-section B-B' in FIG. 5A. The CESL 46 may be formed of silicon nitride, silicon carbo-nitride, or the like. The CESL 46 may be formed using a conformal deposition method such as ALD or CVD, for example. The ILD 48 layer may include a dielectric material formed using, for example, FCVD, spin-on coating, CVD, or another deposition method. The ILD layer 48 may also be formed of an oxygen-containing dielectric material, which may be silicon-oxide based such as silicon oxide, phospho-silicate glass (PSG), boro-silicate glass (BSG), boron-doped phospho-silicate glass (BPSG), or the like. Subsequently, a planarization process such as chemical mechanical polish (CMP) process or mechanical grinding process may be performed to level the top surfaces of the ILD layer 48, the CESL 46, and the dummy gate stacks 30a, 30b, 30c, 30d, and the gate spacers 38 with each other, resulting in the structure in FIG. 5B.

Figure 6:
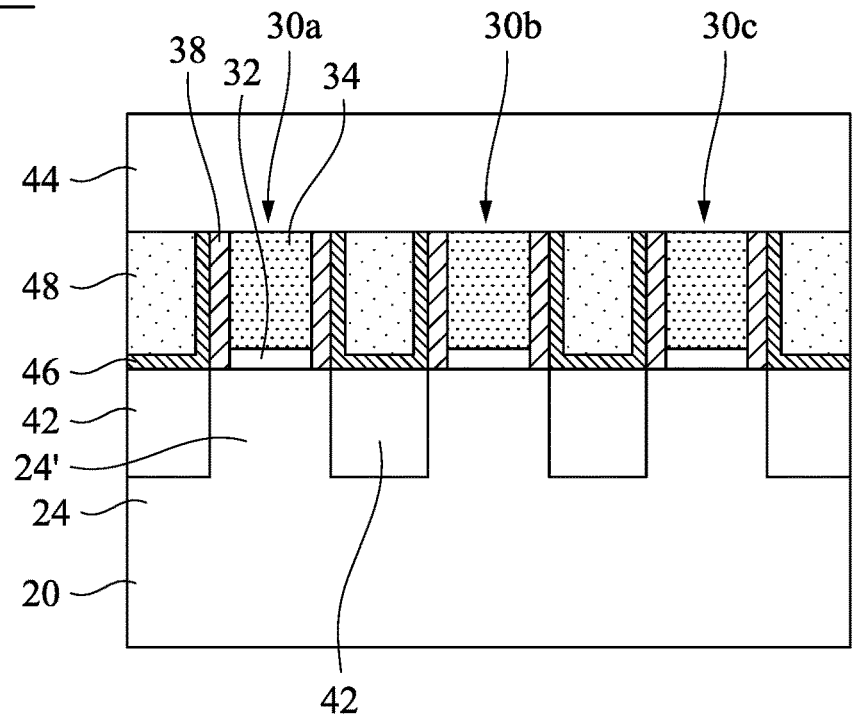

Reference is made to FIG. 6. A hard mask layer 44 is deposited over the CESL 46, the ILD layer 48, the gate spacers 38, and the dummy gate stacks 30a, 30b, 30c by a suitable process, such as spin-on coating. The hard mask layer 44 may be made of a material suitable for blocking the ions subsequently implanted into the dummy gate stacks 30a, 30c and the gate spacers 38, the CESL 46, the ILD layer 48 adjacent to the gate stacks 30a, 30c as described below. In some embodiments, the hard mask layer 44 may be made of nitride base dielectric or oxide base dielectric, other suitable materials, or combinations thereof. For example, the hard mask layer 44 may include SiO, SiN, SiOC, SiON, SiOCN, combinations thereof, or other suitable materials. In some embodiments, the hard mask layer 44 may be made of metal oxide dielectric or other suitable materials. For example, the hard mask layer 44 may be made of Hf oxide (e.g., $HfO_2$), Ta oxide (e.g., $Ta_2O_5$), Ti oxide (e.g., $TiO_2$), Zr oxide (e.g., $ZrO_2$), Al oxide (e.g., $Al_2O_3$), Y oxide (e.g., $Y_2O_3$), or combinations thereof.

Figure 7:
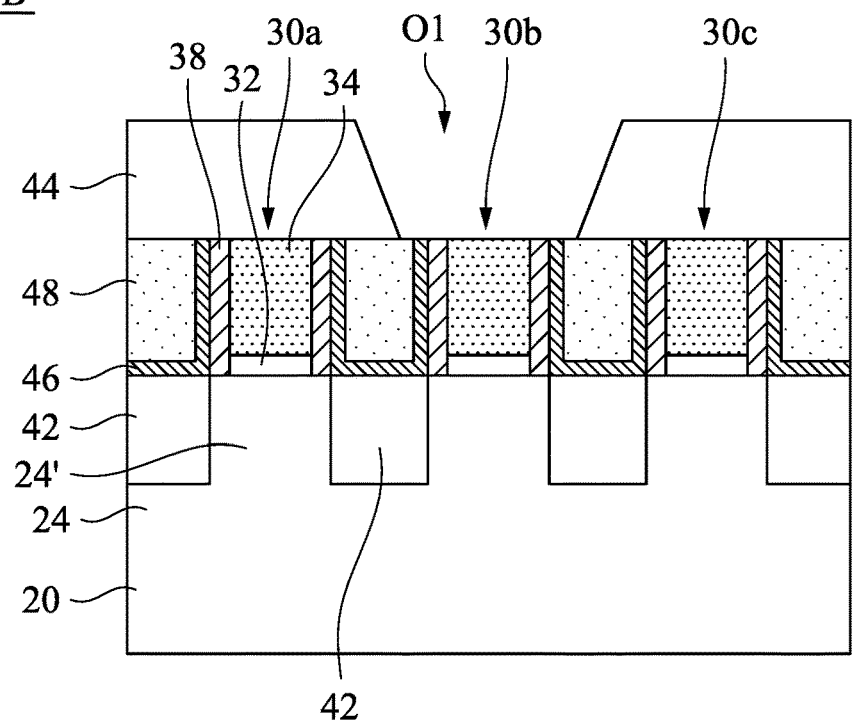
Figure 13:
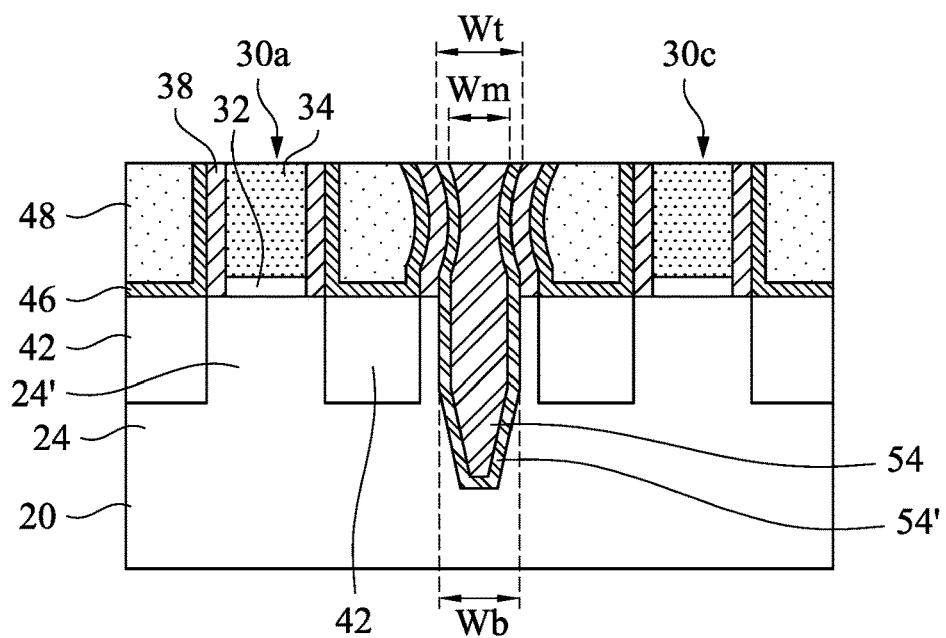

Reference is made to FIG. 7. The hard mask layer 44 is patterned to form a trench O1 that exposes the dummy gate stack 30b, and the gate spacers 38, the CESL 46, and the ILD layer 48 adjacent to the dummy gate stack 30b, and the dummy gate stacks 30a and 30c remain covered by the hard mask layer 44. The trench O1 has a longitudinal axis parallel with a longitudinal axis of the dummy gate stack 30b, and thus from a top view the trench O1 has a strip shape overlapping the strip-shaped dummy gate stack 30b. The hard mask layer 44 can be patterned by the lithographic process of exposing the hard mask layer 44 using a photo-reticle (mask) and then developing away the exposed hard mask layer 44. A fin isolation region (see the fin isolation region 54 as shown in FIG. 13) will be formed to inherit the dummy gate stack 30b through the trench O1 in the subsequent process and further extend into the fin 24' (see FIG. 11A). In some embodiments, the fin isolation region can be interchangeably referred to as a cut-poly on OD Edge (CPODE) region. The respective process may also be referred to as a CPODE process. The fin isolation region will separate the source/drain regions of neighboring the semiconductor devices from each other and separate different semiconductor devices. Therefore, the fin isolation region is provided to cut the noise coupling path, which in turn reduces coupling effects between different semiconductor devices causing noise increases, signal delays, logic errors, and integrated circuit malfunctions.

The present disclosure in various embodiments provides an implantation process performed at different stages (see FIGS. 8, 9B, 10B, 11B) at least on the dielectric layer 48 where the fin isolation region 54 (see FIG. 16) will be formed therearound. The implanted dielectric layer 48 can be interchangeably referred to as a stress memorization technology (SMT) layer that can control the profile of the adjacent fin isolation region 54 formed subsequently, so as to improve the process window for forming the source-drain contact 68 (see FIG. 17B) and silicide 69 (see FIG. 17B) in the source/drain contact opening adjacent to the fin isolation region 54, such that the resistance of the source-drain contact 68 can be reduced.

Figure 8:
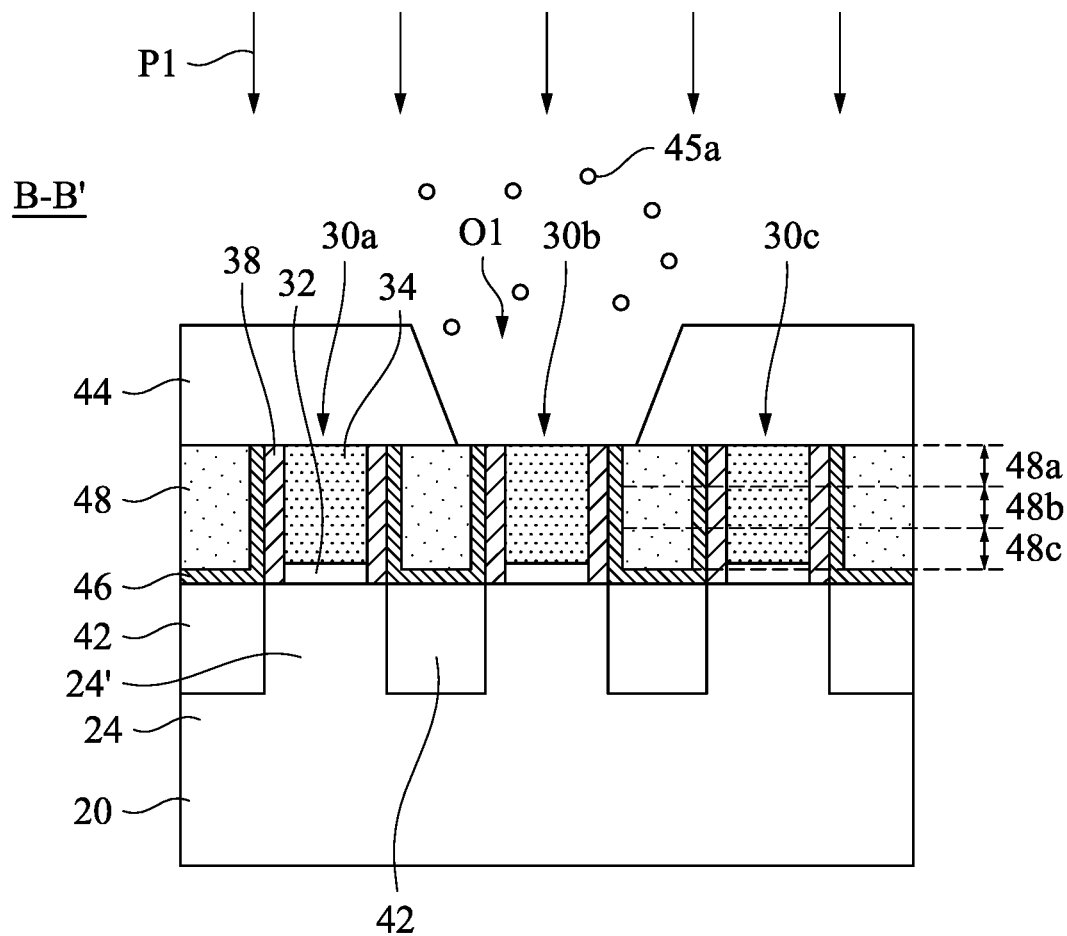

Reference is made to FIG. 8. An ion implantation process P1 may be performed to implant dopants 45a into the exposed dummy gate stack 30b, and the gate spacers 38, the CESL 46, and the ILD layer 48 adjacent to the dummy gate stack 30b through the trench O1, so as to adjust the stress value thereof. The implantation breaks the bonding of the exposed ILD layer 48 so that the dopants 45a of the implantation are bonded to the ILD layer 48 in the subsequent annealing processes (see FIG. 12). The implanted ILD layer 48 is above the epitaxy region 42 and adjacent to the dummy gate stack 30b. The implanted ILD layer 48 has a lattice constant different from that of the epitaxy region 42 and the dummy gate stack 30b so that stresses between two materials are formed. In some embodiments, the implanted ILD layer 48 can be interchangeably referred to as a stress memorization technology (SMT) layer a tensile stress or a compressive stress after an annealing process.

Figure 11A:
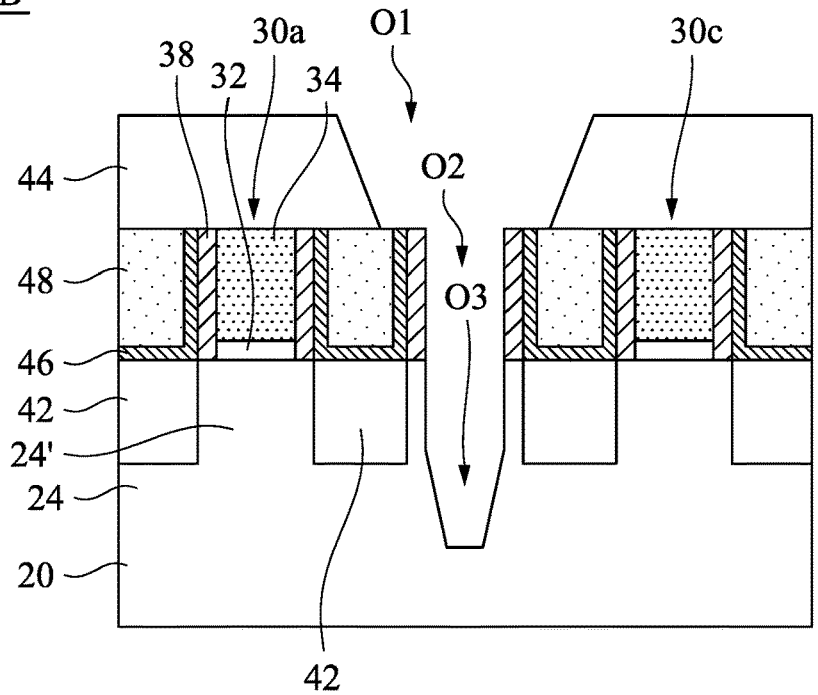

In some embodiments, the dummy gate stack 30b will be removed in a subsequent process as shown in FIG. 11A, so as to be formed as the fin isolation region 54 as shown in FIG. 13. Because of the ion implantation process P1 that was performed on the exposed portion, such as the ILD layer 48, when a subsequent annealing process (see FIG. 12) is performed, the shape of the exposed portion may be altered, in particular, the ILD layer 48 may have expanded regions to release the stress as described in more detail below.

The ion implantation process P1 creates an implantation region within the dummy gate stack 30b, and the gate spacers 38, the CESL 46, and the ILD layer 48 adjacent to the gate stack 30b with vertical and lateral dimensions controlled by the implant energy, implant species, implantation angle and/or implant dosage of the ion implantation process P1. In some embodiments, the dopants 45a, such as $Ge^+$ ions, may be used for the ion implantation process P1. Other suitable dopant species such as As, Xe, or In may be used in different examples. Due to the implantation angle of the ion implantation process P1, a middle portion 48b of the implanted ILD layer 48 may have a greater dopant concentration than upper and lower portions 48a, 48c of the implanted ILD layer 48. By way of example and not limitation, the implantation angle of the ion implantation process P1 may be greater than about 1 degree. In some embodiments, the implanted ILD layer 48 may have a greater dopant concentration in an upper portion 48a thereof than in a lower portion 48c thereof. In some embodiments, the lower portion 48c of the exposed ILD layer 48 is free of dopant.

In some embodiments, after the ion implantation process P1, the implanted ILD layer 48 may have a dopant concentration gradient, e.g., decreasing as a distance from a top surface of the ILD layer 48 increases. In some embodiments, the implanted ILD layer 48 may have a dopant concentration decreasing as a distance from the dummy gate stack 30b increases. In some embodiments, the ILD layer 48 between the dummy gate stacks 30a and 30b has a greater dopant concentration than the ILD layer 48 at a side of the dummy gate stack 30a away from the dummy gate stacks 30b in a same level height. In some embodiments, the ILD layer 48 at a side of the dummy gate stack 30a away from the dummy gate stacks 30b is free of dopant.

In some embodiments, the dopant 45a can be implanted in the dummy gate dielectric 32, the dummy gate electrode 34, the gate spacers 38, and/or the CESL 46 exposed from the trench O1. In some embodiments, a vertical portion of the CESL 46 adjacent to the dummy gate stack 30b has a greater dopant concentration than a lateral portion of the CESL 46 adjacent to the dummy gate stack 30b. In some embodiments, the lateral portion of the CESL 46 under the trench O1 is free of dopant. In some embodiments, the implanted dummy gate dielectric 32, dummy gate electrode 34, gate spacer 38, and/or CESL 46 can be interchangeably referred to as a stress memorization technology (SMT) layer, which will provide a tensile stress or a compressive stress after an annealing process.

In some embodiments, the implantation on the exposed portion, such as ILD layer 48, may be performed using varying energies and doses depending on the desired results. For example, different doses and energies may be used for the ion implantation. In some embodiments, the ion implantation process P1 may have an implantation energy in a range from about 10 to 20 KeV, such as about 10, 12, 14, 16, 18, or 20 KeV. In some embodiments, the ion implantation process P1 may have a dose in a range from about $1.0 \times 10^{15}$ to $3.0 \times 10^{15}$ atoms/centimeter$^3$, such as about 1, 1.5, or 3 atoms/centimeter$^3$. In some embodiments, the ion implantation process P1 may be performed under a temperature in a range from about 100 to 200° C., such as 100, 150, or 200° C.

Figure 9A:
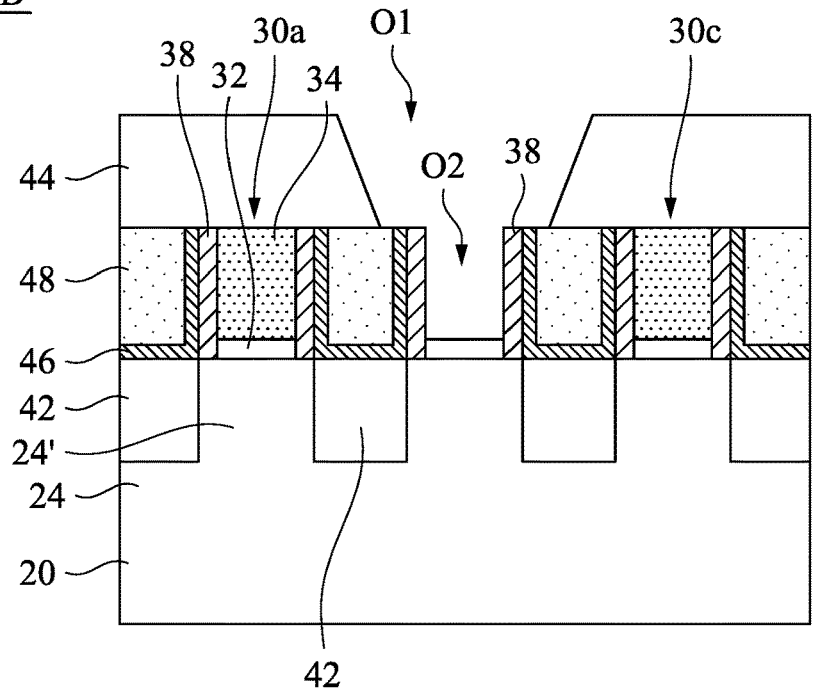
Figure 10A:
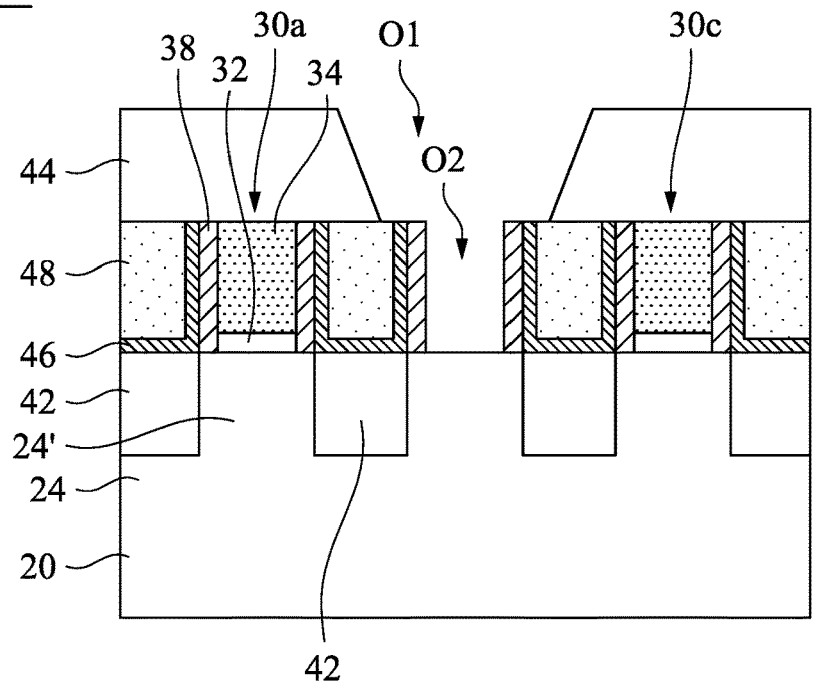

Reference is made to FIGS. 9A and 10A. The dummy gate electrode 34 (see FIG. 9A) and the dummy gate dielectric 32 (see FIG. 10A) of the dummy gate stack 30b are removed to form a gate trench O2 with the gate spacers 38 as their sidewalls. The dummy gate stack 30b may be removed by dry etching, wet etching, or a combination of dry and wet etching. For example, a wet etching process may include exposure to a hydroxide containing solution (e.g., ammonium hydroxide), deionized water, and/or other suitable etchant solutions.

Figure 9B:
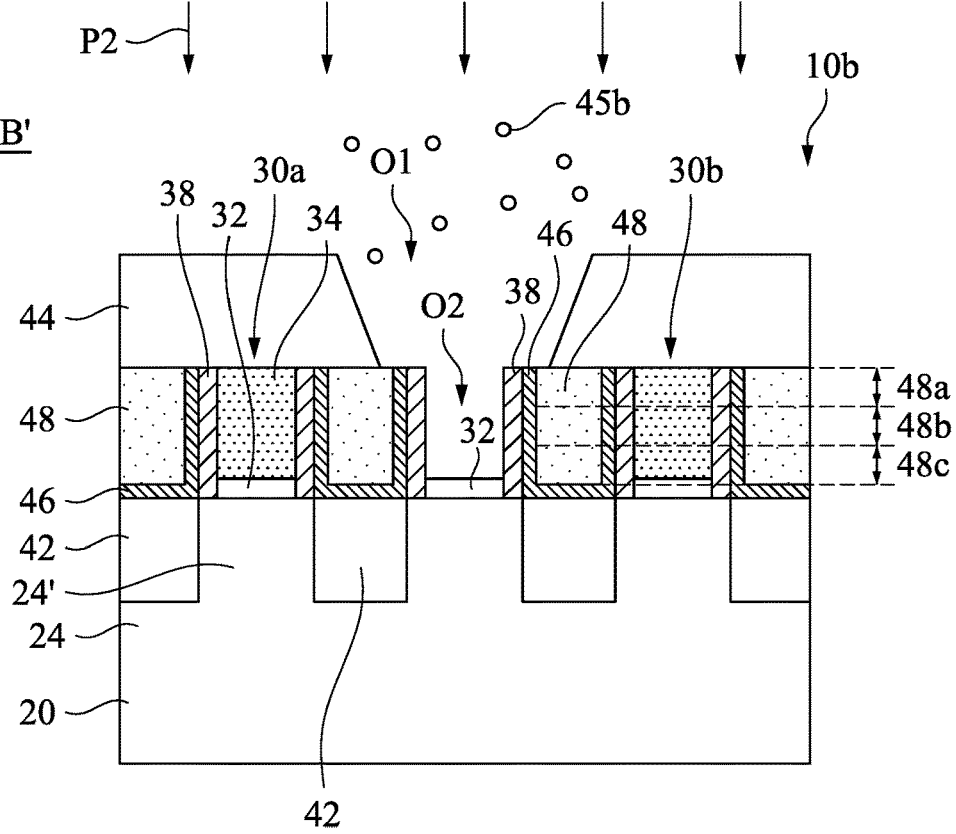

FIG. 9B shows a cross-sectional view of a wafer 10b in accordance with another embodiment of the present disclosure. The wafer 10b differs from that shown in FIG. 8 in that it is shown at a later stage of processing. Also, the ion implantation of the present embodiment can be performed at a later stage than in the embodiment shown in FIG. 8. That is, an ion implantation process P2 can be performed to implant dopants 45b into the dummy gate dielectric 32, the gate spacers 38, the CESL 46, and the ILD layer 48 around the gate trench O2 after removing the dummy gate electrode 34.

The ion implantation process P2 creates an implantation region within the dummy gate dielectric 32, the gate spacers 38, the CESL 46, and the ILD layer 48 around the gate trench O2 with vertical and lateral dimensions controlled by the implant energy, implant species, implantation angle and/or implant dosage of the ion implantation process P2. In some embodiments, the dopants 45b, such as Ge$^+$ ions, may be used for the ion implantation process P2. Other suitable dopant species such as As, Xe, or In may be used in different examples. Due to the implantation angle of the ion implantation process P2, a middle portion 48b of the implanted ILD layer 48 may have a greater dopant concentration than upper and lower portions 48a, 48c of the implanted ILD layer 48. By way of example and not limitation, the implantation angle of the ion implantation process P2 may be greater than about 1 degree. In some embodiments, the implanted ILD layer 48 may have a greater dopant concentration in an upper portion 48a thereof than in a lower portion 48c thereof. In some embodiments, the lower portion 48c of the exposed ILD layer 48 is free of dopant.

In some embodiments, after the ion implantation process P2, the implanted ILD layer 48 may have a dopant concentration decreasing as a distance from a top surface of the ILD layer 48 increases. In some embodiments, the implanted ILD layer 48 may have a dopant concentration decreasing as a distance from the gate trench O2 increases. In some embodiments, the ILD layer 48 adjacent to the gate trench O2 may have a greater dopant concentration than the ILD layer 48 at a side of the dummy gate stack 30a away from the gate trench O2 in a same level height. In some embodiments, the ILD layer 48 at a side of the dummy gate stack 30a away from the gate trench O2 is free of dopant.

In some embodiments, the dopant may be implanted in the dummy gate dielectric 32, the gate spacers 38 and/or the CESL 46 exposed from the trench O1. In some embodiments, a vertical portion of the CESL 46 adjacent to the gate trench O2 has a greater dopant concentration than a lateral portion of the CESL 46 adjacent to the gate trench O2. In some embodiments, the lateral portion of the CESL 46 under the trench O1 is free of dopant. In some embodiments, the implanted dummy gate dielectric 32, gate spacers 38 and/or the CESL 46 can be interchangeably referred to as a stress memorization technology (SMT) layer.

In some embodiments, the ion implantation process P2 on the exposed portion, such as ILD layer 48, may be performed using varying energies and doses depending on the desired results. For example, different doses and energies may be used for the ion implantation process P2. In some embodiments, the ion implantation process P2 may have an implantation energy in a range from about 10 to 20 KeV, such as about 10, 12, 14, 16, 18, or 20 KeV. In some embodiments, the ion implantation process P2 may have a dose in a range from about $1.0 \times 10^{15}$ to $3.0 \times 10^{15}$ atoms/centimeter$^3$, such as about 1, 1.5, or 3 atoms/centimeter$^3$. In some embodiments, the ion implantation process P2 may be performed under a temperature in a range from about 100 to 300° C., such as 100, 150, or 300° C.

Figure 10B:
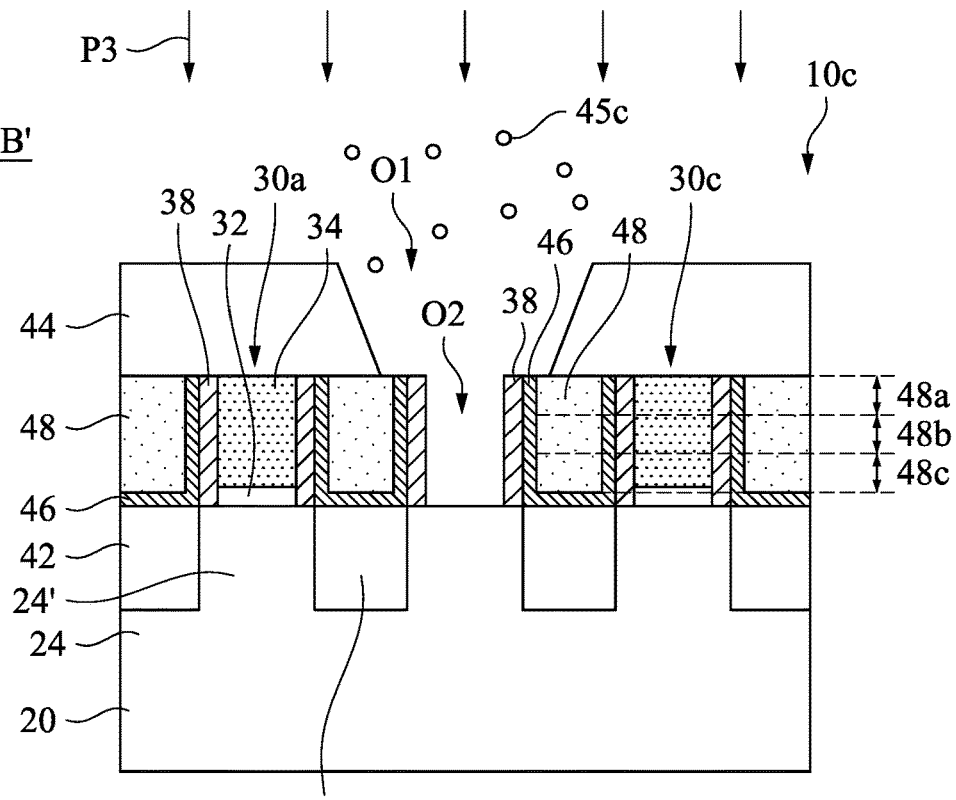

FIG. 10B shows a cross-sectional view in accordance with another embodiment of the present disclosure. The wafer 10c differs from that shown in FIGS. 8 and 9B in that it is shown at a later stage of processing. Also, the ion implantation of the present embodiment can be performed at a later stage than in the embodiment shown in FIGS. 8 and 9B. That is, an ion implantation process P3 can be performed to implant dopants 45c into the gate spacers 38, the CESL 46, and the ILD layer 48 around the gate trench O2 after removing the dummy gate dielectric 32.

The ion implantation process P3 creates an implantation region within the gate spacers 38, the CESL 46, and the ILD layer 48 adjacent to the gate trench O2 with vertical and lateral dimensions controlled by the implant energy, implant species, implantation angle and/or implant dosage of the ion implantation process P3. In some embodiments, the dopants 45c, such as Ge$^+$ ions, may be used for the ion implantation process P3. Other suitable dopant species such as As, Xe, or In may be used in different examples. Due to the implantation angle of the ion implantation process P3, a middle portion 48b of the implanted ILD layer 48 may have a greater dopant concentration than upper and lower portions 48a, 48c of the implanted ILD layer 48. By way of example and not limitation, the implantation angle of the ion implantation process P3 may be greater than about 1 degree. In some embodiments, the implanted ILD layer 48 may have a greater dopant concentration in an upper portion 48a thereof than in a lower portion 48c thereof. In some embodiments, the lower portion 48c of the exposed ILD layer 48 is free of dopant.

In some embodiments, after the ion implantation process P3, the implanted ILD layer 48 may have a dopant concentration decreasing as a distance from a top surface of the ILD layer 48 increases. In some embodiments, the implanted ILD layer 48 may have a dopant concentration decreasing as a distance from the gate trench O2 increases. In some embodiments, the ILD layer 48 adjacent to the gate trench O2 may have a greater dopant concentration than the ILD layer 48 at a side of the dummy gate stack 30a away from the gate trench O2 in a same level height. In some embodiments, the ILD layer 48 at a side of the dummy gate stack 30a away from the gate trench O2 is free of dopant.

In some embodiments, the dopant 45c may be implanted in the gate spacers 38 and/or the CESL 46 exposed from the trench O1. In some embodiments, a vertical portion of the CESL 46 adjacent to the gate trench O2 has a greater dopant concentration than a lateral portion of the CESL 46 adjacent to the gate trench O2. In some embodiments, the lateral portion of the CESL 46 under the trench O1 is free of dopant. In some embodiments, the implanted gate spacer 38, and/or CESL 46 can be interchangeably referred to as a stress memorization technology (SMT) layer.

In some embodiments, the ion implantation process P3 on the exposed portion, such as ILD layer 48, may be performed using varying energies and doses depending on the desired results. For example, different doses and energies may be used for the ion implantation process P3. In some embodiments, the ion implantation process P3 may have an implantation energy in a range from about 10 to 20 KeV, such as about 10, 12, 14, 16, 18, or 20 KeV. In some embodiments, the ion implantation process P3 may have a dose in a range from about $1.0 \times 10^{15}$ to $3.0 \times 10^{15}$ atoms/centimeter$^3$, such as about 1, 1.5, or 3 atoms/centimeter$^3$. In some embodiments, the ion implantation process P3 may be performed under a temperature in a range from about 100 to 300° C., such as 100, 150, or 300° C.

Reference is made to FIG. 11A. FIG. 11A illustrates a cross-sectional view of the formation of a trench O3 where a fin isolation region 54 (see FIG. 13) will be formed therein. The fin isolation region 54 can be interchangeably referred to as a cut-poly on OD Edge (CPODE) region. The respective process may also be referred to as a CPODE process. The trench O3 may separate the source/drain regions 42 of neighboring semiconductor devices from each other and separate different semiconductor devices. The formation of the trench O3 includes using the hard mask layer 44 to etch dummy gate stack 30b. In the etching process, the dummy gate stack 30b is first etched anisotropically, until the underlying protruding fins 24' are exposed. The etching may be stopped on isolation regions 22. Subsequently, the fins 24' are then etched, and the etching continues down into the underlying semiconductor fins 24, and further into the underlying bulk portions of semiconductor substrate 20. In some embodiments, an etching selectivity between the semiconductor substrate 20 and the gate spacer 38 is greater than approximately 10. In some embodiments, an etching selectivity between the semiconductor substrate 20 and the CESL 46 is larger than approximately 10. In some embodiments, an etching selectivity between the semiconductor substrate 20 and the ILD layer 48 is larger than approximately 10. In some embodiments, the gate spacer 38, the CESL 46, and the ILD layer 48 may serve as a protection layer to its underlying components, for example, the epitaxy region 42.

Figure 11B:
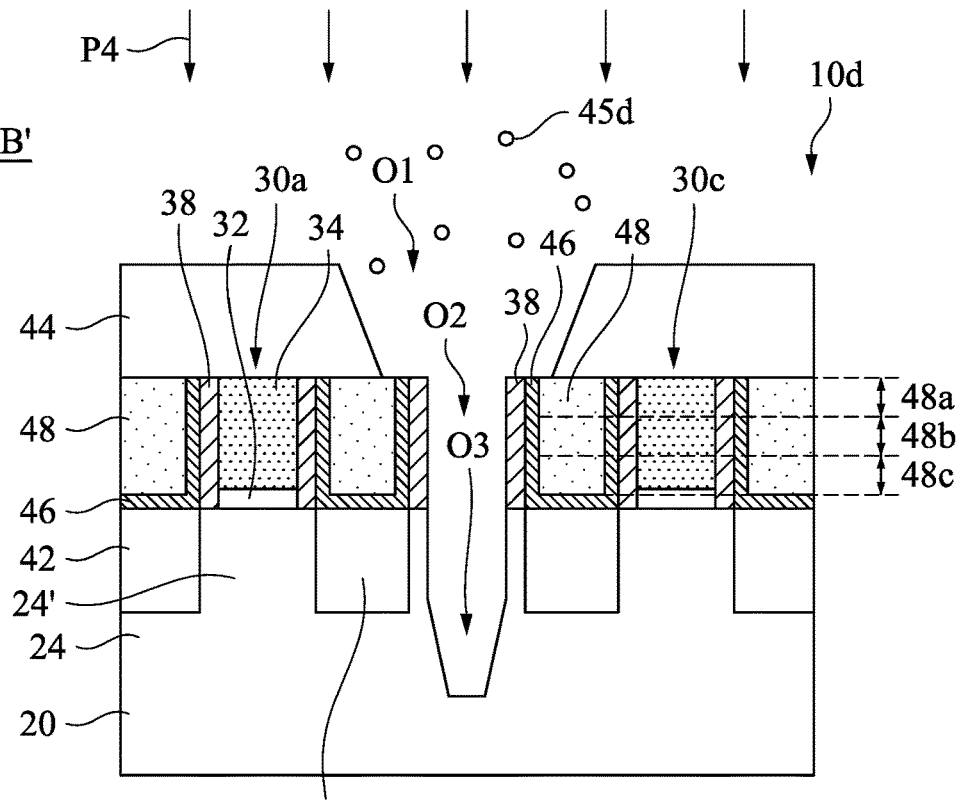

FIG. 11B shows a cross-sectional view in accordance with another embodiment of the present disclosure. The wafer 10d differs from those shown in FIGS. 8, 9B, and 10B in that it is shown at a later stage of processing. Also, the ion implantation of the present embodiment can be performed at a later stage than in the embodiment shown in FIGS. 8, 9B, and 10B. An ion implantation process P4 can be performed to implant dopants 45d into the gate spacers 38, the CESL 46, and the ILD layer 48 around the gate trench O2 after forming the trench O3.

The ion implantation process P4 creates an implantation region within the gate spacers 38, the CESL 46, and the ILD layer 48 adjacent to the gate trench O2 with vertical and lateral dimensions controlled by the implant energy, implant species, implantation angle and/or implant dosage of the ion implantation process P4. In some embodiments, the dopants 45d, such as Ge$^+$ ions, may be used for the ion implantation process P4. Other suitable dopant species such as As, Xe, or In may be used in different examples. Due to the implantation angle of the ion implantation process P4, a middle portion 48b of the implanted ILD layer 48 may have a greater dopant concentration than upper and lower portions 48a, 48c of the implanted ILD layer 48. By way of example and not limitation, the implantation angle of the ion implantation process P4 may be greater than about 1 degree. In some embodiments, the implanted ILD layer 48 may have a greater dopant concentration in an upper portion 48a thereof than in a lower portion 48c thereof. In some embodiments, the lower portion 48c of the exposed ILD layer 48 is free of dopant.

In some embodiments, after the ion implantation process P4, the implanted ILD layer 48 may have a dopant concentration decreasing as a distance from a top surface of the ILD layer 48 increases. In some embodiments, the implanted ILD layer 48 may have a dopant concentration decreasing as a distance from the gate trench O2 increases. In some embodiments, the ILD layer 48 adjacent to the gate trench O2 may have a greater dopant concentration than the ILD layer 48 at a side of the dummy gate stack 30a away from the gate trench O2 in a same level height. In some embodiments, the ILD layer 48 at a side of the dummy gate stack 30a away from the gate trench O2 is free of dopant. In some embodiments, the dopant 45d may be implanted in the gate spacers 38 and/or the CESL 46 exposed from the trench O1. In some embodiments, a vertical portion of the CESL 46 adjacent to the gate trench O2 has a greater dopant concentration than a lateral portion of the CESL 46 adjacent to the gate trench O2. In some embodiments, the lateral portion of the CESL 46 under the trench O1 is free of dopant. In some embodiments, the implanted gate spacer 38, and/or CESL 46 can be interchangeably referred to as a stress memorization technology (SMT) layer.

In some embodiments, the ion implantation process P4 on the exposed portion, such as ILD layer 48, may be performed using varying energies and doses depending on the desired results. For example, different doses and energies may be used for the ion implantation process P4. In some embodiments, the ion implantation process P4 may have an implantation energy in a range from about 10 to 20 KeV, such as about 10, 12, 14, 16, 18, or 20 KeV. In some embodiments, the ion implantation process P4 may have a dose in a range from about $1.0 \times 10^{15}$ to $3.0 \times 10^{15}$ atoms/centimeter$^3$, such as about 1, 1.5, or 3 atoms/centimeter$^3$. In some embodiments, the ion implantation process P4 may be performed under a temperature in a range from about 100 to 300° C., such as 100, 150, or 300° C.

Figure 12:
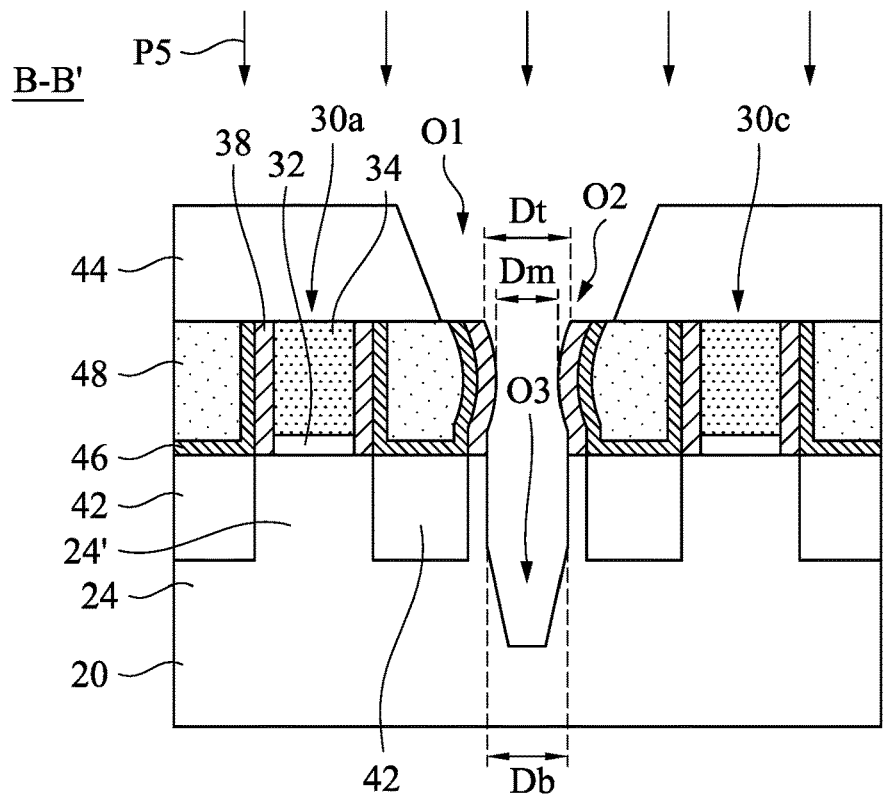

Reference is made to FIG. 12. An annealing process P5 is performed on the substrate 20. During the annealing process P5 is performed, a stress value of the implanted ILD layer 48 is increased as the Si—N—H bonds are broken in the ILD layer 48 and more H atoms escape, which causes the implanted ILD layer 48 to be more tensile or compressive during the annealing process P5. Thus, the implanted ILD layer 48 will spontaneously expand towards the empty trench O3 to release the stress. Examples of the annealing process P5 may include, but are not limited to, RTA, furnace annealing, flashing annealing, laser annealing, and other suitable processes. By way of example but not limiting the present disclosure, the annealing process P5 may be a flash anneal (micro-second annealing, ussA) having a peak temperature ramp profile, the peak temperature ramp profile having a peak temperature ranging from about 1000° C. to about 1200° C., such as 1000, 1050, 1100, 1150, or 1200° C.

In some embodiments, after the annealing process P5, the trench O3 has a narrower lateral dimension Dm at a position level with a middle position of the dummy gate stack 30a than at positions level with bottom and top positions of the dummy gate stack 30a. For example, the width Dm of the trench O3 level with the middle position of the dummy gate stack 30a may be less than widths Db and Dt of the trench O3 level with the bottom and top positions of the dummy gate stack 30a. In some embodiments, the trench O3 has a width decreasing from a position level with the bottom position of the dummy gate stack 30a to a position level with the middle position of the dummy gate stack 30a and increasing from the position level with the middle position of the dummy gate stack 30a to a position level with the top position of the dummy gate stack 30a. In some embodiments, a sidewall of the trench O3 is curved from the position level with the bottom position of the dummy gate stack 30a to the position level with the top position of the dummy gate stack 30a.

Reference is made to FIG. 13. A dielectric material is deposited into the trench O3, followed by a planarization process to remove excess portions of the dielectric material. The remaining dielectric material forms the fin isolation region 54. The fin isolation region 54 may separate the source/drain regions 42 of neighboring semiconductor devices from each other and separate different semiconductor devices. In some embodiments, the fin isolation region 54 may have a narrower width Wm at a position level with the middle position of the dummy gate stack 30a than widths Wb and Wt at positions level with bottom and top positions of the dummy gate stack 30a. In some embodiments, the fin isolation region 54 may have a width decreasing from a position level with the bottom position of the dummy gate stack 30a to a position level with the middle position of the dummy gate stack 30a and increasing from the position level with the middle position of the dummy gate stack 30a to a position level with the top position of the dummy gate stack 30a. In some embodiments, the fin isolation region 54 may have a concave sidewall profile above top surfaces of the fins 24' from the cross-sectional view. For example, a sidewall of the fin isolation region 54 may be curved from the position level with the bottom position of the dummy gate stack 30a to the position level with the top position of the dummy gate stack 30a.

In some embodiments, the deposition of the dielectric material of isolation regions 54 is performed using a conformal deposition process such as ALD, which may be PEALD, thermal ALD, or the like. The dielectric material may be formed of or comprise SiN, $SiO_2$, SiOC, SiOCN, or the like, or combinations thereof. The fin isolation region 54 may be formed of a homogenous material, or may have a composite structure including more than one layer. The fin isolation regions 54 may include dielectric liners 54', which may be formed of, for example, silicon oxide. In some embodiments, the dielectric material of isolation region 54 comprises SiN, and the deposition is performed using process gases including dichlorosilane and ammonia. Hydrogen ($H_2$) may or may not be added. The deposition process may be performed using PEALD at a temperature in a range between about 450° C. and about 650° C. In some embodiments, the implanted CESL 46, and gate spacer 38 form sidewall spacer around the fin isolation region 54.

Figure 14:
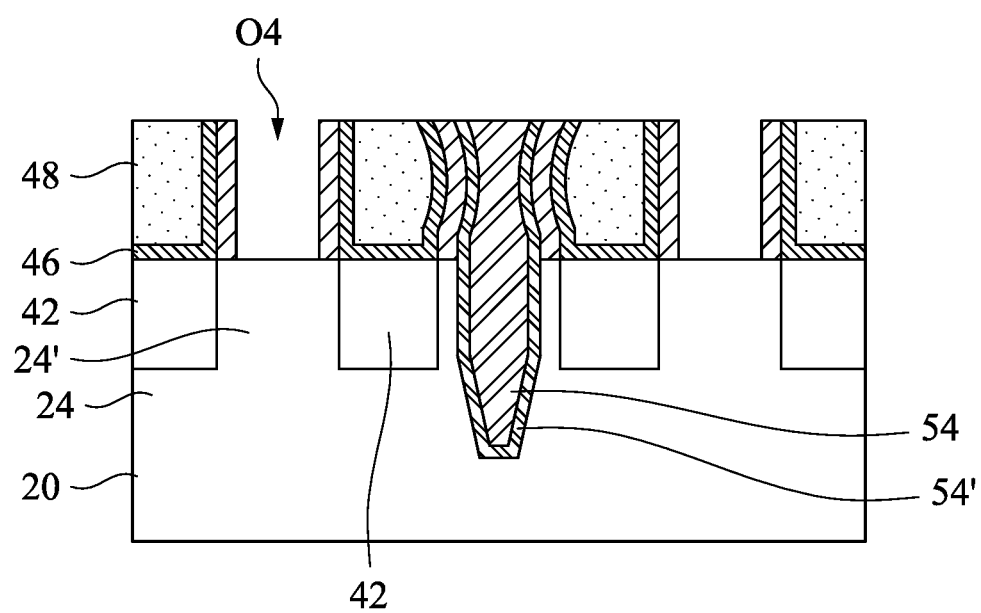
Figure 15A:
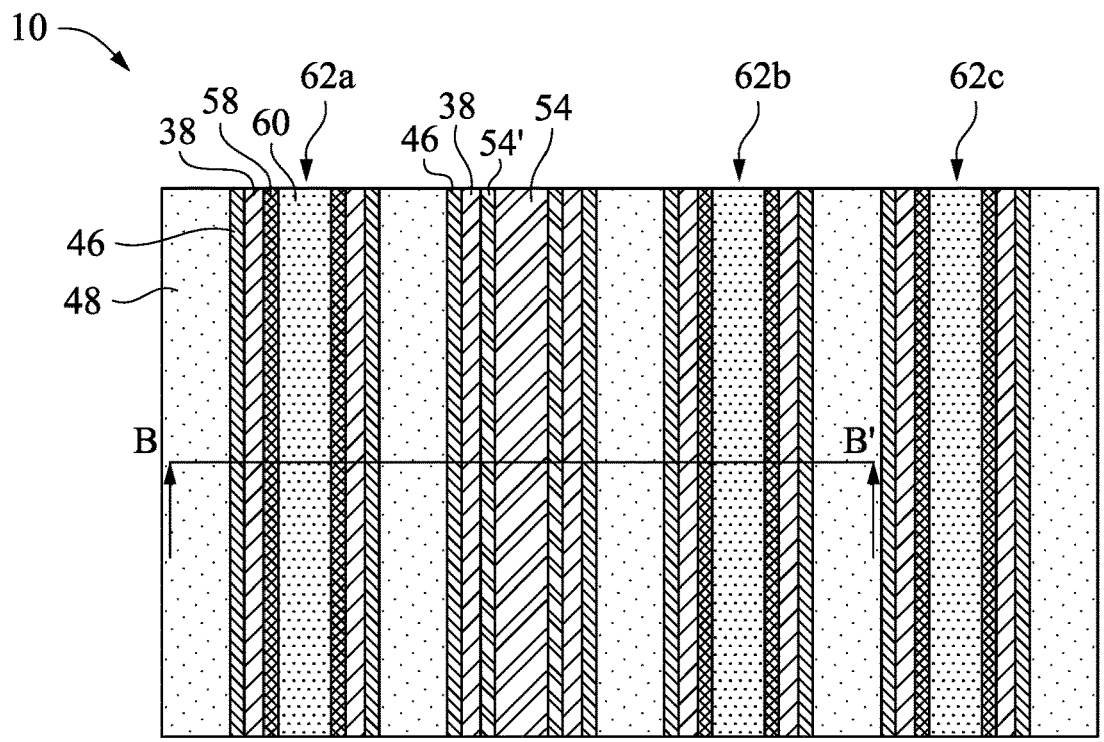
Figure 15B:
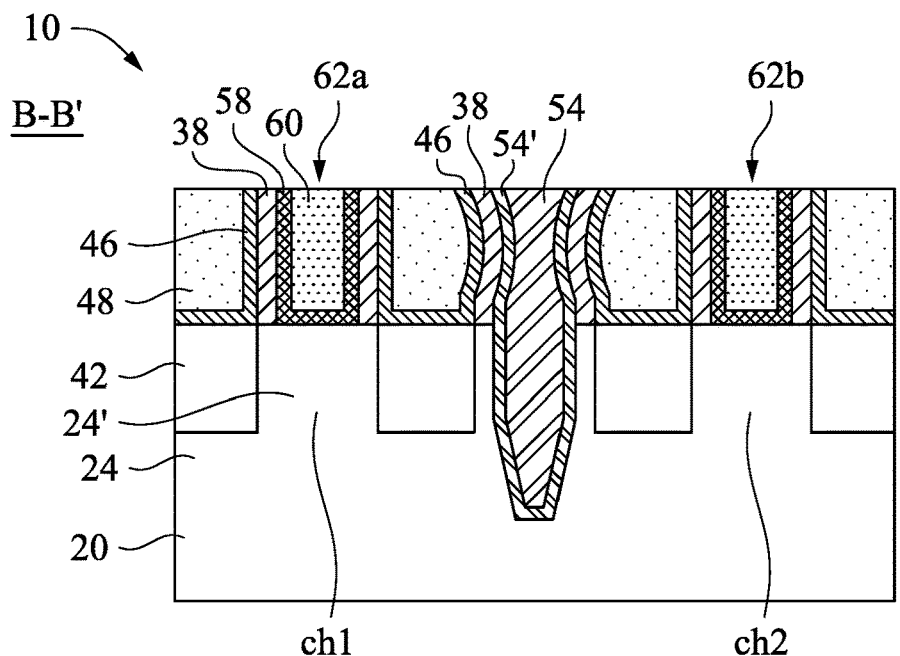

Reference is made to FIGS. 14, 15A, and 15B. FIGS. 14, 15A, and 15B illustrate the formation of replacement gate stacks 62a, 62b, 62c (see FIGS. 15A and 15B). The dummy gate stacks 30a, 30c as shown in FIG. 13 are removed through etching, and gate trenches O4 are formed as shown in FIG. 14. FIG. 15A illustrates a plane view (a top view) of the part of the wafer 10 after the formation of gate stacks 62a, 62b, 62c. FIG. 15l illustrates a cross-sectional view obtained from reference cross-section B-B' in FIG. 15A. As shown in FIGS. 15A and 15B, the replacement gate stacks 62a, 62b, 62c are formed, which include gate dielectric layers 58 and gate electrodes 60. The formation of gate stacks 62a, 62b, 62c includes forming/depositing a plurality of layers, and then performing a planarization process such as a CMP process or a mechanical grinding process. In some embodiments, the replacement gate stacks 62a, 62b, 62c can be interchangeably referred to as gate strips or gate patterns. As shown in FIGS. 15A and 15B, the replacement gate stacks 62a and 62b extend across separated portions ch1 and ch2 of the protruding fins 24', respectively. In some embodiments, the separated portions ch1 and ch2 of the protruding fins 24' can be interchangeably referred to as semiconductive channel patterns.

In some embodiments, each of gate dielectric layers 58 includes an interfacial layer as its lower part. The interfacial layer is formed on the exposed surfaces of the fins 24'. The interfacial layer may include an oxide layer such as a silicon oxide layer, which is formed through the thermal oxidation process or a chemical oxidation process to oxidize a surface layer of each of protruding fins 24', or a deposition process. Each of the gate dielectric layers 58 may also include a high-k dielectric layer formed over the IL. The high-k dielectric layer may include a high-k dielectric material such as $HfO_2$, $ZrO_2$, HfZrOx, HfSiOx, HfSiON, ZrSiOx, HfZrSiOx, $Al_2O_3$, HfAlOx, HfAlN, ZrAlOx, $La_2O_3$, $TiO_2$, $Yb_2O_3$, silicon nitride, or the like. The dielectric constant (k-value) of the high-k dielectric material is higher than 3.9, and may be higher than about 7.0. The high-k dielectric layer may be formed as conformal layers, and extends on the sidewalls of the fins 24' and the sidewalls of the gate spacers 38. In some embodiments, the high-k dielectric layers in gate dielectric layers 58 are formed using ALD, CVD, or the like.

The gate electrodes 60 are formed on top of the gate dielectric layers 58, and fill the remaining portions of the trenches left by the removed dummy gate stacks. The sub-layers in the gate electrodes 60 are not shown separately, while the sub-layers may be distinguishable from each other due to the difference in their compositions. The deposition of at least lower sub-layers may be performed using conformal deposition methods such as ALD or CVD, so that the thickness of the vertical portions and the thickness of the horizontal portions of the gate electrodes 60 (and each of sub-layers) are substantially equal to each other. The sub-layers in the gate electrodes 60 may include, and are not limited to, a Titanium Silicon Nitride (TiSN) layer, a tantalum nitride (TaN) layer, a titanium nitride (TiN) layer, a titanium aluminum (TiAl) layer, an additional TiN and/or TaN layer, and a filling metal region. Gate electrodes 60 are referred to as the metal gates 60 hereinafter. Some of these sub-layers define the work function of the respective semiconductor device. Furthermore, the metal layers of a p-type semiconductor device and the metal layers of an n-type semiconductor device may be different from each other so that the work functions of the metal layers are suitable for the respective p-type or n-type semiconductor devices. The filling metal may include tungsten, cobalt, or the like.

Figure 16:
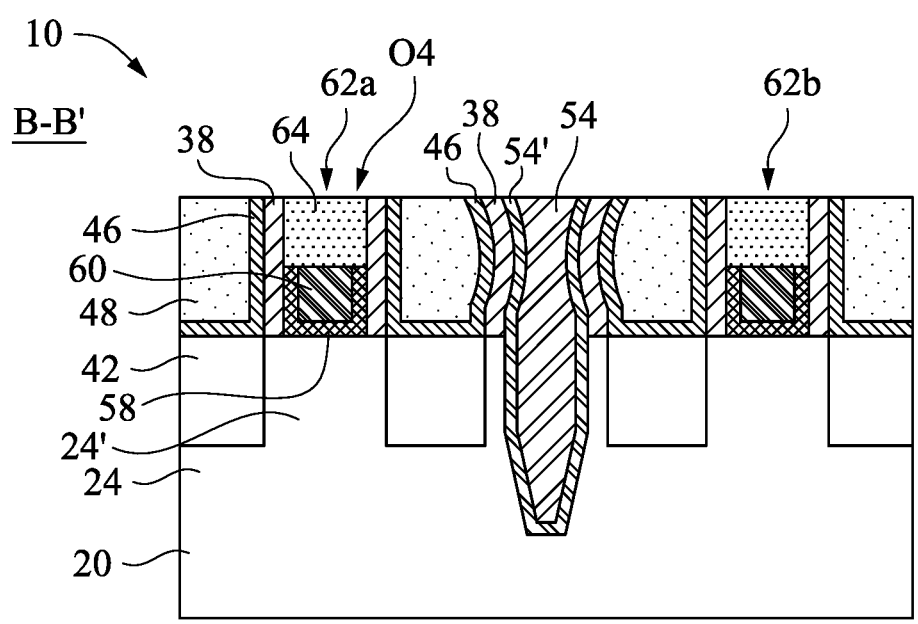

Reference is made to FIG. 16. Dielectric caps 64 are formed over the replacement gate stacks 62a, 62b as shown in FIG. 16. Firstly, a metal gate etch back (MGEB) process is performed on the replacement gate stacks 62a, 62b to scale down the replacement gate stacks 62a, 62b. The MGEB process may include a bias plasma etching step. The bias plasma etching step may be performed to remove a portion of the replacement gate stacks 62a, 62b to thin down the replacement gate stacks 62a, 62b. A portion of the gate trench O4 may reappear with a shallower depth. A top surface of the replacement gate stacks 62a, 62b may be no longer level with the ILD layer 48. Sidewalls of the gate spacer 38 are then exposed from the replacement gate stacks 62a, 62b. In some embodiments, the bias plasma etching step may use a gas mixture of $Cl_2$, $O_2$, $BCl_3$, and Ar with a bias in a range from about 25V to about 1200V.

Subsequently, the dielectric caps 64 are formed over the replacement gate stacks 62a, 62b using, for example, a deposition process to deposit a dielectric material over the substrate 105, followed by a CMP process to remove excess dielectric material outside the gate trench O2. In some embodiments, the dielectric caps 64 may include SiNs, SiOx, SiON, SiC, SiBN, SiCBN, other suitable dielectric materials, or combinations thereof. The dielectric caps 64 may have different etch selectivity than the gate spacer 38, the CESL 46, and/or the ILD layer 48, so as to selective etch back the dielectric caps 64. By way of example, if the dielectric caps 64 may be made of silicon nitride, the gate spacer 38, the CESL 46, and/or the ILD layer 48 may be made of a dielectric material different from silicon nitride. The dielectric caps 64 can be used to define self-aligned source/drain contact region and thus referred to as a self-aligned contact (SAC) structure or a SAC layer. In some embodiments, the dielectric caps 64 can be interchangeably referred to as protective structures or protective layers.

Figure 17A:
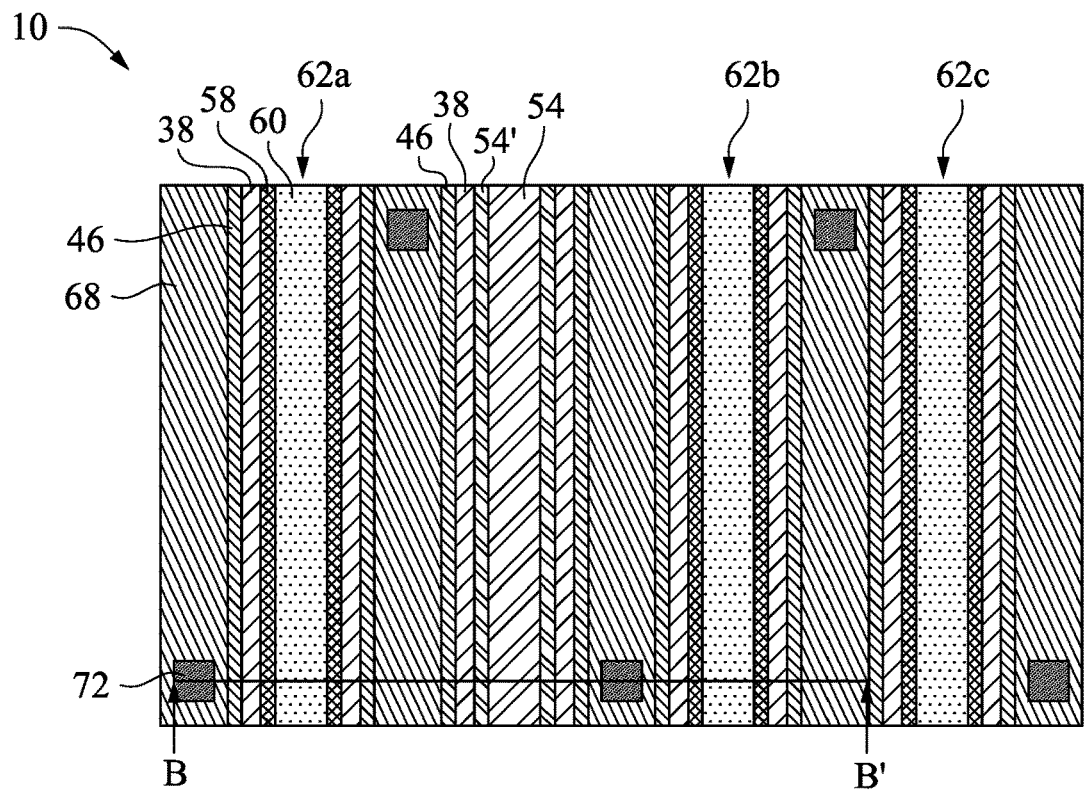
Figure 17B:
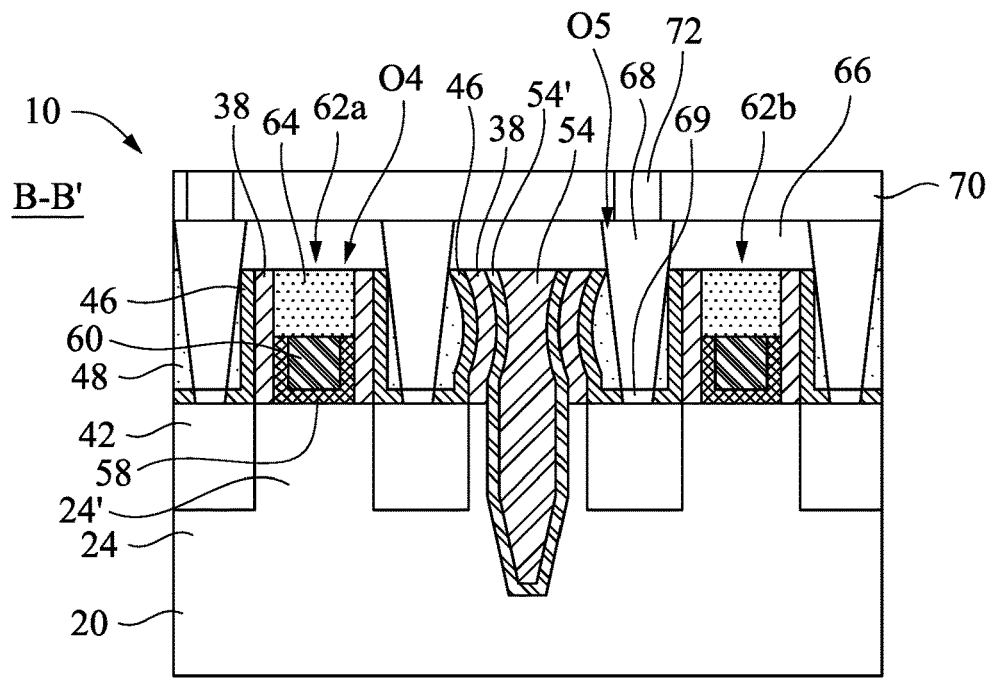

Reference is made to FIGS. 17A and 17B. FIG. 17A illustrates a plane view (a top view) of the part of the wafer 10 after the formation of source/drain contacts 68 and the source/drain vias 72. FIG. 17B illustrates a cross-sectional view obtained from reference cross-section B-B' in FIG. 17A. The ILD layer 66 is deposited over the gate spacers 38, the CESL 46, the ILD layer 48, and the dielectric cap 64. In some embodiments, the ILD layer 66 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. In some embodiments, the ILD layer 66 may be formed using, for example, CVD, ALD, spin-on-glass (SOG) or other suitable techniques. Subsequently, one or more etching process may be performed to etch through the ILD layer 66 down to the epitaxy regions 42 to form a source/drain contact trenches O5. Each source/drain contact trench O5 has a longitudinal axis parallel with longitudinal axes of the gate structures and longitudinal axes of the CPODE patterns. In some embodiments, the etching process is an anisotropic dry etching process (e.g., a reactive-ion etching (RIE) process or an atomic layer etching (ALE) process). By way of example and not limitation, a dry etching process may implement an oxygen-containing gas, a fluorine-containing gas (e.g., $CF_4$, $SF_6$, $CH_2F_2$, $CHF_3$, $CH_3F$ and/or $C_4F_8$), a chlorine-containing gas (e.g., $Cl_2$ and/or $BCl_3$), a bromine-containing gas (e.g., HBr), an iodine-containing gas, other suitable gases and/or plasmas, and/or combinations thereof.

Subsequently, the source/drain contacts 68 are formed in the source/drain contact trenches O5 and lands on the epitaxy regions 42. In some embodiments, the source/drain contact 68 can be interchangeably referred to as a metal-diffusion (MD) layer. The source/drain contacts 68 inherit profiles of the source/drain contact trenches O5, and thus each source/drain contact 68 has a longitudinal axis parallel with longitudinal axes of the gate structures and longitudinal axes of the CPODE patterns, as illustrated in the top view of FIG. 17A. In some embodiments, the source/drain contacts 68 may formed by using a metallization process as well as the use of metal electroplating techniques to fill the source/drain contact opening O5. In some embodiments, in order to avoid diffusion of metal from the source/drain contacts 68 into the ILD layer 48, a barrier layer (not shown) is used between the source/drain contacts 68 and the ILD layer 48. The barrier layer may line the source/drain contact opening O5. The barrier layer functions as a diffusion barrier to prevent metal diffusion and as an adhesion layer between metal and dielectric. By way of example but not limitation, refractory metals, refractory metal-nitrides, refractory metal-silicon-nitrides and combinations thereof may be used for the barrier layer, such as TaN, Ta, Ti, TiN, TiSiN, WN, or combinations thereof. In some embodiments, the barrier layer may include a TaN layer and a Ta layer. In some embodiments, the barrier layer is a TiN layer. In some embodiments, the barrier layer is a Ti layer. In some embodiments, a metal seed layer (not shown) is then formed on the barrier layer. In some embodiments, the metal seed layer is a copper seed layer that may be formed by physical vapor deposition by way of example but not limitation.

Subsequently, the substrate 20 may be transferred to a plating tool, such as an electrochemical plating (ECP) tool, and a conductive layer is plated on the substrate 20 by the plating process to fill the source/drain contact opening O5. While ECP process is described herein, the embodiment is not limited to ECP deposited metal. The conductive layer may include a low resistivity conductor material selected from the group of conductor materials including, but not limited to, copper and copper-based alloy. Alternatively, the conductive layer may include various materials, such as cobalt, tungsten, ruthenium, aluminum, gold, silver, another suitable conductive material, or combinations thereof. In some embodiments, the conductive layer may be a copper-containing layer formed over the copper seed layer. Subsequently, the excess portions of the conductive layer, the metal seed layer, and the barrier layer are removed, either through etching, chemical mechanical polishing (CMP), or the like, forming the upper surface of the metal-filled opening substantially coplanar with a top surface of the ILD layer 66. The remaining portions of the conductive layer and the barrier layer in the source/drain contact opening O5 forms the source/drain contacts 68.

In some embodiments, before the source/drain contacts 68 are formed, silicide layers 69 may be formed on the epitaxy regions 42 by a metal silicidation process. The metal silicidation process is to make a reaction between metal and silicon (or polycrystalline silicon). Regarding the metal silicidation process, a first rapid thermal annealing (RTA) process may be performed in, for example, Ar, He, $N_2$ or other inert atmosphere at a first temperature, such as lower than 200~300° C., to convert the deposited metal layer into metal silicide. This is followed by an etching process to remove the unreacted metal layer from. The etching process may include a wet etch, a dry etch, and/or a combination thereof. As an example, the etchant of the wet etching may include a mixed solution of $H_2SO_4$, $H_2O_2$, $H_2O$, and/or other suitable wet etching solutions, and/or combinations thereof. Then, a second annealing or RTA step at a second temperature higher than the first temperature, such as 400~500° C., thereby forming stable silicide layers 69 with low resistance. In some embodiments, the silicide layers 69 may include titanium silicide (TiSi), nickel silicide (NiSi), cobalt silicide (CoSi), Ni—Pt, or combinations thereof.

As shown in FIG. 17B, an ILD layer 70 is deposited over the ILD layer 66. In some embodiments, the ILD layer 70 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. In some embodiments, the ILD layer 70 may be formed using, for example, CVD, ALD, spin-on-glass (SOG) or other suitable techniques. Subsequently, the source/drain vias 72 are formed to pass through the ILD layer 70 and land on the source/drain contacts 68. In some embodiments, the source/drain via 72 may include various materials, such as cobalt, tungsten, ruthenium, aluminum, gold, silver, another suitable conductive material, or combinations thereof. In some embodiments, the source/drain via 72 may be a copper-containing layer formed over the copper seed layer.

In order to reduce coupling effects between different semiconductor devices in scaled down chip area, a continuous poly on oxide definition edge (CPODE) pattern is provided to cut the noise coupling path. The CPODE pattern is formed by firstly forming a trench by removing a dummy material and a portion of a semiconductor body, and then filling a dielectric material in the trench. However, when a source/drain contact opening is formed laterally adjacent to the CPODE pattern, the CPODE pattern will squeeze the source/drain contact opening, so that the size of the source-drain contact (i.e., metal-diffusion (MD) layer) subsequently formed in the opening will become smaller. In addition, the smaller size of the opening will be difficult to form silicide therein, which in turn further increases the resistance of the source-drain contact.

Therefore, based on the above discussions, it can be seen that the present disclosure offers advantages. It is understood, however, that other embodiments may offer additional advantages, and not all advantages are necessarily disclosed herein, and that no particular advantage is required for all embodiments. The present disclosure in various embodiments provides an implantation process performed on a dielectric layer where the CPODE pattern will be formed therearound. The implanted dielectric layer can be interchangeably referred to as a stress memorization technology (SMT) layer that can control the profile of the adjacent CPODE pattern formed subsequently, so as to prevent the CPODE pattern from squeezing the source/drain contact opening in the implanted dielectric layer and improve the process window for forming the source-drain contact, such that the resistance of the source-drain contact can be reduced.

In some embodiments, a method includes forming first and second gate stacks extending across a semiconductor fin on a substrate; forming source/drain regions in the semiconductor fin, wherein one of the source/drain region is between the first and second gate stacks; forming a dielectric layer laterally surrounding the first and second gate stacks; forming a mask layer covering the first gate stack, while at least leaving the a first portion of the dielectric layer between the first and second gate stacks exposed; with the mask layer in place, doping the first portion of the dielectric layer between the first and second gate stacks with a dopant; removing the second gate stack to form a gate trench next to the doped first portion of the dielectric layer; performing an annealing process to expand the doped first portion of the dielectric layer toward the gate trench; forming an isolation structure in the gate trench and next to the expanded first portion of the dielectric layer; forming a source/drain contact extending through the dielectric layer to the one of the source/drain regions. In some embodiments, the dopant comprises germanium. In some embodiments, the first portion of the dielectric layer has a greater dopant concentration than a second portion of the dielectric layer at a side of the first gate stack away from the second gate stack. In some embodiments, the second portion of the dielectric layer at the side of the first gate stack away from the second gate stack is free of dopant. In some embodiments, doping the first portion of the dielectric layer is performed with a dose in a range from about $1.0 \times 10^{15}$ to $3.0 \times 10^{15}$ atoms/centimeter$^3$. In some embodiments, the method further includes forming a gate spacer on a sidewall of the second gate stack, wherein doping the first portion of the dielectric layer further dopes the gate spacer with the dopant. In some embodiments, the method further includes before forming the dielectric layer, forming an etch sop layer over the one of the source/drain region, wherein doping the first portion of the dielectric layer further dopes the etch sop layer with the dopant. In some embodiments, doping the first portion of the dielectric layer is performed with an implantation energy in a range from about 10 to 20 KeV. In some embodiments, doping the first portion of the dielectric layer is performed at a temperature in a range from about 100 to 200° C. In some embodiments, the annealing process is performed with a peak temperature ramp profile having a peak temperature ranging from about 1000° C. to about 1200° C.

In some embodiments, a method includes forming a nanostructured pedestal on a substrate, the nanostructured pedestal having a top surface and opposite side surfaces; forming first and second gate strips wrapping around the top surface and the opposite side surfaces of the nanostructured pedestal; forming first epitaxial structures on the nanostructured pedestal and at opposite sides of the first gate strip and second epitaxial structures on the nanostructured pedestal at opposite sides of the second gate strip; forming an isolation structure interposing the first and second gate strips and partially in the nanostructured pedestal, a first position of the isolation structure level with a middle level height of the first gate strip having a narrower width than a second position of the isolation structure level with the top surface of the nanostructured pedestal; forming a dielectric layer laterally surrounding the first and second gate strips and the isolation structure. In some embodiments, the first position of the isolation structure level with the middle level height of the first gate strip having a narrower width than a third position of the isolation structure level with a top surface of the first gate strip. In some embodiments, a portion of the dielectric layer laterally between the isolation structure and the first gate strip comprises germanium. In some embodiments, a first position of the dielectric layer level with the middle level height of the first gate strip has a greater dopant concentration than a second position of the dielectric layer level with the top surface of the nanostructured pedestal. In some embodiments, the isolation structure has a concave sidewall profile.

In some embodiments, a semiconductor device includes first and second semiconductive channel patterns, first and second gate patterns, first source/drain patterns, second source/drain patterns, a fin isolation structure, and a dielectric layer. The first and second gate patterns are across the first and second channel patterns from a top view. The first source/drain patterns are on opposite sides of the first gate pattern. The second source/drain patterns are on opposite sides of the second gate pattern. The fin isolation structure interposes the first source/drain patterns and the second source/drain patterns. The dielectric layer laterally surrounds the first and second gate patterns and the fin isolation structure, in which a first portion of the dielectric layer laterally between the fin isolation structure and the first gate pattern is doped with germanium. In some embodiments, the fin isolation structure has a narrower width at a position level with a middle level height of the first gate pattern than at positions level with bottom and top level heights of the first gate pattern. In some embodiments, the fin isolation structure has a concave sidewall profile above top surfaces of the first and second semiconductor channel patterns from a cross-sectional view. In some embodiments, the semiconductor device further includes a spacer on a sidewall of the fin isolation structure, wherein the spacer is doped with germanium. In some embodiments, a second portion of the dielectric layer at a side of the first gate pattern away from the fin isolation structure is free of germanium.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming first and second gate stacks extending across a semiconductor fin on a substrate;
   forming source/drain regions in the semiconductor fin, wherein one of the source/drain region is between the first and second gate stacks;
   forming a dielectric layer laterally surrounding the first and second gate stacks;
   forming a mask layer covering the first gate stack, while at least leaving the a first portion of the dielectric layer between the first and second gate stacks exposed;
   with the mask layer in place, doping the first portion of the dielectric layer between the first and second gate stacks with a dopant;
   removing the second gate stack to form a gate trench next to the doped first portion of the dielectric layer;
   performing an annealing process to expand the doped first portion of the dielectric layer toward the gate trench;
   forming an isolation structure in the gate trench and next to the expanded first portion of the dielectric layer; and
   forming a source/drain contact extending through the dielectric layer to the one of the source/drain regions.

2. The method of claim 1, wherein the dopant comprises germanium.

3. The method of claim 1, wherein the first portion of the dielectric layer has a greater dopant concentration than a second portion of the dielectric layer at a side of the first gate stack away from the second gate stack.

4. The method of claim 3, wherein the second portion of the dielectric layer at the side of the first gate stack away from the second gate stack is free of dopant.

5. The method of claim 1, wherein doping the first portion of the dielectric layer is performed with a dose in a range from about $1.0 \times 10^{15}$ to $3.0 \times 10^{15}$ atoms/centimeter$^3$.

6. The method of claim 1, further comprising:
   forming a gate spacer on a sidewall of the second gate stack, wherein doping the first portion of the dielectric layer further dopes the gate spacer with the dopant.

7. The method of claim 1, further comprising:
   before forming the dielectric layer, forming an etch sop layer over the one of the source/drain region, wherein doping the first portion of the dielectric layer further dopes the etch sop layer with the dopant.

8. The method of claim 1, wherein doping the first portion of the dielectric layer is performed with an implantation energy in a range from about 10 to 20 KeV.

9. The method of claim 1, wherein doping the first portion of the dielectric layer is performed at a temperature in a range from about 100 to 200° C.

10. The method of claim 1, wherein the annealing process is performed with a peak temperature ramp profile having a peak temperature ranging from about 1000° C. to about 1200° C.

11. A method, comprising:
    forming a nanostructured pedestal on a substrate, the nanostructured pedestal having a top surface and opposite side surfaces;
    forming first and second gate strips wrapping around the top surface and the opposite side surfaces of the nanostructured pedestal;
    forming first epitaxial structures on the nanostructured pedestal and at opposite sides of the first gate strip and second epitaxial structures on the nanostructured pedestal at opposite sides of the second gate strip;
    forming an isolation structure interposing the first and second gate strips and partially in the nanostructured pedestal, a first position of the isolation structure level with a middle level height of the first gate strip having a narrower width than a second position of the isolation structure level with the top surface of the nanostructured pedestal; and
    forming a dielectric layer laterally surrounding the first and second gate strips and the isolation structure, wherein a first position of the dielectric layer level with the middle level height of the first gate strip has a greater dopant concentration than a second position of the dielectric layer level with the top surface of the nanostructured pedestal.

12. The method of claim 11, wherein the first position of the isolation structure level with the middle level height of the first gate strip having a narrower width than a third position of the isolation structure level with a top surface of the first gate strip.

13. The method of claim 11, wherein a portion of the dielectric layer laterally between the isolation structure and the first gate strip comprises germanium.

14. The method of claim 11, wherein the isolation structure has a concave sidewall profile.

15. A semiconductor device, comprising:
first and second semiconductive channel patterns;
first and second gate patterns across the first and second semiconductive channel patterns from a top view;
first source/drain patterns on opposite sides of the first gate pattern;
second source/drain patterns on opposite sides of the second gate pattern;
a fin isolation structure interposing the first source/drain patterns and the second source/drain patterns; and
a dielectric layer laterally surrounding the first and second gate patterns and the fin isolation structure, wherein a first portion of the dielectric layer laterally between the fin isolation structure and the first gate pattern is doped with germanium, a first position of the first portion of the dielectric layer level with a middle level height of the first gate pattern has a greater germanium concentration than a second position of the first portion of the dielectric layer level with a top surface of the first semiconductive channel pattern.

16. The semiconductor device of claim 15, wherein the fin isolation structure has a narrower width at a position level with the middle level height of the first gate pattern than at positions level with bottom and top level heights of the first gate pattern.

17. The semiconductor device of claim 15, wherein the fin isolation structure has a concave sidewall profile above top surfaces of the first and second semiconductive channel patterns from a cross-sectional view.

18. The semiconductor device of claim 15, further comprising:
a spacer on a sidewall of the fin isolation structure, wherein the spacer is doped with germanium.

19. The semiconductor device of claim 15, wherein a second portion of the dielectric layer at a side of the first gate pattern away from the fin isolation structure is free of germanium.

20. The semiconductor device of claim 15, further comprising:
an etch sop layer interposing between one of the first source/drain patterns and the first portion of the dielectric layer, wherein the etch sop layer is doped with germanium.

* * * * *